(12) United States Patent
Kim et al.

(10) Patent No.: US 9,451,691 B2
(45) Date of Patent: Sep. 20, 2016

(54) ARRAY PRINTED CIRCUIT BOARD, METHOD OF REPLACING DEFECTIVE SINGLE PRINTED CIRCUIT BOARD OF THE SAME, AND METHOD OF MANUFACTURING ELECTRONIC APPARATUS USING THE SAME

(71) Applicants: Young-hoon Kim, Asan-si (KR); Hyun-seok Choi, Seoul (KR); Joo-han Lee, Asan-si (KR); Da-hye Choe, Asan-si (KR)

(72) Inventors: Young-hoon Kim, Asan-si (KR); Hyun-seok Choi, Seoul (KR); Joo-han Lee, Asan-si (KR); Da-hye Choe, Asan-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 71 days.

(21) Appl. No.: 14/458,249

(22) Filed: Aug. 12, 2014

(65) Prior Publication Data

US 2015/0075844 A1 Mar. 19, 2015

(30) Foreign Application Priority Data

Sep. 13, 2013 (KR) .................. 10-2013-0110619

(51) Int. Cl.
*H05K 1/02* (2006.01)
*H05K 1/11* (2006.01)
*H05K 1/14* (2006.01)
*H05K 3/22* (2006.01)
*H05K 3/00* (2006.01)

(52) U.S. Cl.
CPC .......... *H05K 1/0268* (2013.01); *H05K 3/0097* (2013.01); *H05K 3/225* (2013.01); *H05K 1/0292* (2013.01); *H05K 3/0052* (2013.01)

(58) Field of Classification Search
CPC .... H05K 1/0268; H05K 1/142; H05K 1/115; H05K 1/0296; H05K 3/0097; H05K 3/225
USPC ........................................ 174/251, 262, 266
See application file for complete search history.

(56) References Cited

U.S. PATENT DOCUMENTS 5,923,539 A 7/1999 Matsui et al.
7,005,735 B2 * 2/2006 Park .................. H01L 23/49838
257/686

(Continued)

FOREIGN PATENT DOCUMENTS

JP 2006134946 A 5/2006
JP 2011095099 A 5/2011

(Continued)

*Primary Examiner* — Timothy Thompson
*Assistant Examiner* — Charles Pizzuto
(74) *Attorney, Agent, or Firm* — Renaissance IP Law Group LLP

(57) ABSTRACT

An array printed circuit board (PCB) is provided in which a defective single PCB may be easily replaced. A method of replacing a defective single PCB and a method of manufacturing an electronic apparatus are also provided. The array PCB may include a plurality of single PCBs. A rail portion may surround the single PCBs. A plurality of tab route portions connect the single PCBs to the rail portion, each of the tab route portions including at least one pair of via electrodes. A test terminal portion may be formed at one side of the rail portion and may include a plurality of test terminals. The at least one pair of via electrodes may include a first via electrode, arranged adjacent to the rail portion and electrically connected to a corresponding test terminal, and a second via electrode arranged adjacent to and electrically connected to a corresponding single PCB.

16 Claims, 21 Drawing Sheets

(56) References Cited

U.S. PATENT DOCUMENTS

| | | | |
|---|---|---|---|
| 7,103,966 B2* | 9/2006 | Choi | B01F 5/10 156/94 |
| 9,153,145 B2* | 10/2015 | Valbuena | G09B 23/183 |
| 2003/0167453 A1* | 9/2003 | Smith | G06F 17/5068 716/122 |
| 2005/0100421 A1* | 5/2005 | Anderson | H05K 3/0052 409/132 |

FOREIGN PATENT DOCUMENTS

| | | |
|---|---|---|
| KR | 20010083271 A | 9/2001 |
| KR | 1020010097476 A | 11/2001 |
| KR | 1020030042949 A | 6/2003 |
| KR | 1020080064452 A | 7/2008 |
| KR | 20090132180 A | 12/2009 |
| KR | 20100026833 A | 3/2010 |

\* cited by examiner

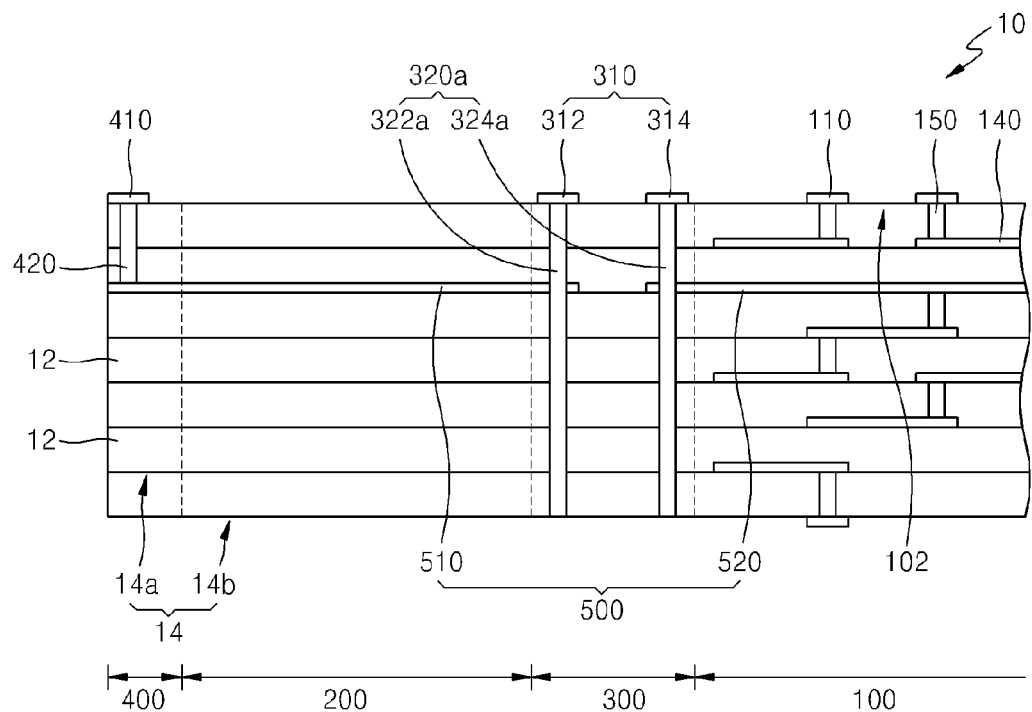
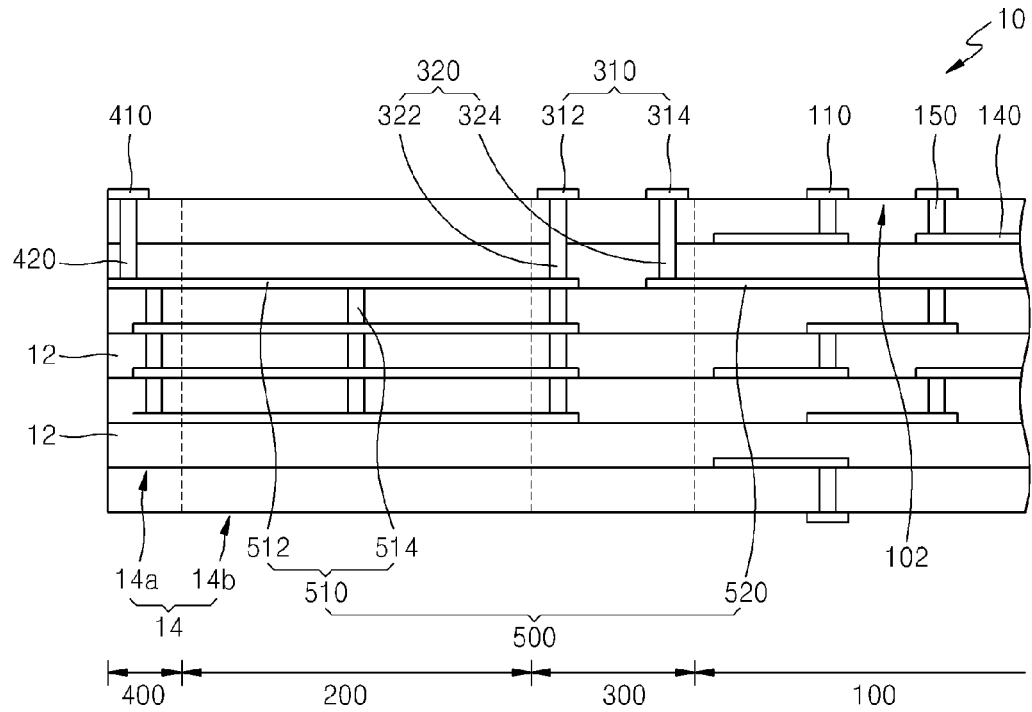

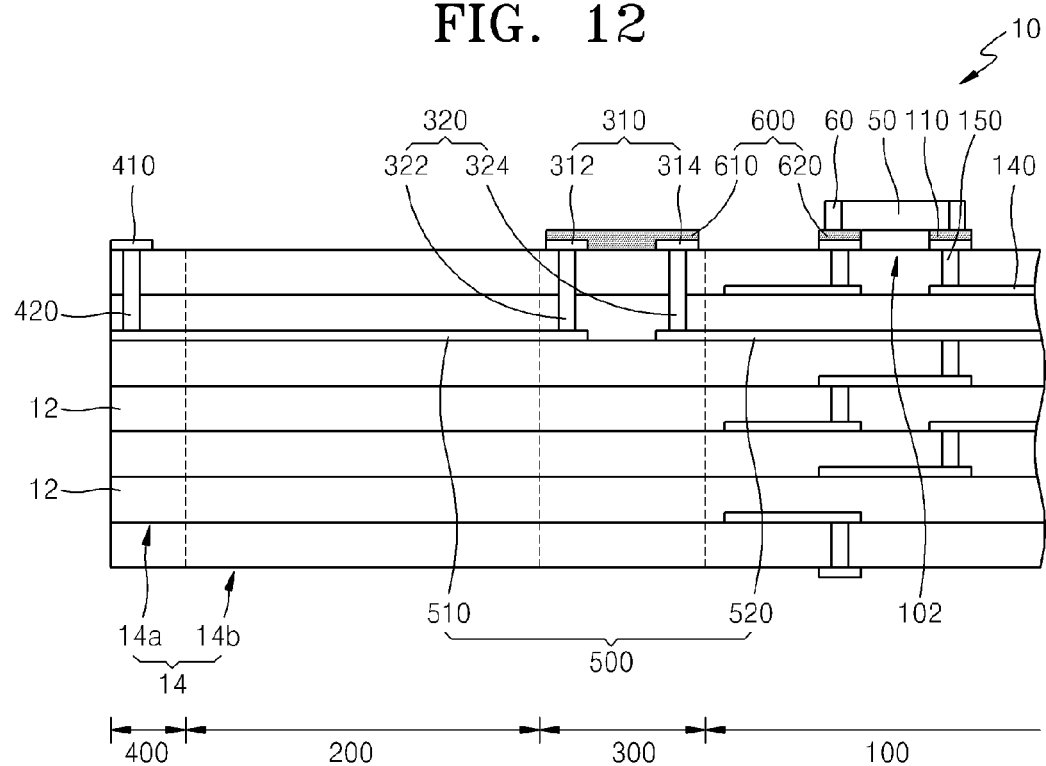

ARRAY PRINTED CIRCUIT BOARD, METHOD OF REPLACING DEFECTIVE SINGLE PRINTED CIRCUIT BOARD OF THE SAME, AND METHOD OF MANUFACTURING ELECTRONIC APPARATUS USING THE SAME

CROSS-REFERENCE TO RELATED APPLICATIONS

This application claims the benefit of Korean Patent Application No. 10-2013-0110619, filed on Sep. 13, 2013, in the Korean Intellectual Property Office, the disclosure of which is incorporated herein in its entirety by reference.

BACKGROUND

The inventive concepts disclosed herein relate to an array printed circuit board (PCB), a method of replacing a defective PCB of the array PCB, and a method of manufacturing an electronic apparatus using the array PCB. More particularly, the inventive concepts provide an array PCB in which a defective PCB is easily replaced, a method of replacing a defective PCB of the array PCB, and a method of manufacturing an electronic apparatus using the array PCB.

An array PCB is formed of a plurality of single PCBs. When one or more of the plurality of single PCBs included in the array PCB are defective, the entire array PCB may be discarded. Unfortunately, however, discarding the entire array PCBs due to one or more defective PCBs in the array reduces the productivity of the PCB manufacturing process. Thus, methods of recycling array PCBs that include one or more defective single PCBs have been used. For instance, a defective single PCB may be removed from the array PCB, and a non-defective single PCB may be joined into a space from which the defective single PCB was removed.

However, when an electronic apparatus is manufactured using a repaired array PCB, a test for the electronic apparatus has to be performed after separating each single PCB from the repaired array PCB, and thus, testing the array PCB for the electronic apparatus can be time consuming, and productivity is lowered.

SUMMARY

The inventive concepts provide an array printed circuit board (PCB) in which a defective single PCB may be easily replaced, and which further allows a test for an electronic apparatus to be performed without separating each single PCB from the array PCB after manufacturing the array PCB.

The inventive concepts also provide a method of easily replacing a defective single PCB of the array PCB.

According to an aspect of the inventive concepts, an array printed circuit board (PCB) comprises a plurality of single PCB portions, each single PCB portion having an electronic device mounting area formed on an upper surface thereof. A rail portion surrounds the plurality of single PCB portions, and a plurality of tab route portions connect the plurality of single PCB portions to the rail portion, each of the plurality of tab route portions comprising at least one pair of via electrodes extending from an upper surface of the each tab route portion toward an inside thereof. A test terminal portion may be formed at one side of the rail portion, the test terminal portion comprising a plurality of test terminals. The at least one pair of via electrodes may comprise a first via electrode located adjacent to the rail portion and a second via electrode arranged adjacent to a corresponding single PCB portion. A first conductive pattern may extend through the rail portion to electrically connect the first via electrode to a test terminal of the test terminal portion. A second conductive pattern may be electrically connected to the second via electrode and extend to the corresponding single PCB portions.

The plurality of single PCB portions, the rail portion, and the plurality of tab route portions may each be formed of a plurality of insulating layers and conductive material layers. More particularly, the plurality of conductive material layers may be separated by the plurality of insulating layers. The first and second conductive patterns may provide at least some of the conductive material layers, and may be arranged in the same layer, interposed between insulating layers.

The first via electrode and the second via electrode may extend from an upper surface of a corresponding tab route portion to the first conductive pattern or the second conductive pattern, respectively.

The first via electrode and the second via electrode may penetrate the first conductive pattern and the second conductive pattern, respectively, from an upper surface of a corresponding tab route portion toward a lower surface of the corresponding tab route portion.

The first conductive pattern and the second conductive pattern may be connected to each other.

The first conductive pattern and the second conductive pattern may be spaced apart from each other in a corresponding tab route portion.

The array PCB may further comprise a first via pad and a second via pad, which may be formed on an upper surface of a corresponding tab route portion and may be connected to the first via electrode and the second via electrode, respectively.

The plurality of single PCB portions, the rail portion, and the plurality of tab route portions may be formed of a plurality of insulating layers and conductive material layers, where the plurality of conductive material layers are separated by the plurality of insulating layers. The first conductive pattern may comprise a plurality of first conductive patterns, each of which connects a test terminal of the test terminal portion to a first via electrode of the plurality of tab route portions. At least some of the plurality of first conductive patterns may provide at least some of the conductive material layers, where at least two conductive material layers are interposed between the plurality of insulating layers.

According to another aspect of the inventive concepts, an array PCB may comprise a plurality of single PCB portions each having an electronic device mounting area formed on an upper surface thereof, a rail portion surrounding the plurality of single PCB portions, and a plurality of tab route portions connecting the plurality of single PCB portions to the rail portion. Each of the plurality of tab route portions may comprise at least one pair of via electrodes extending from an upper surface of the tab route portion toward an inside thereof, and a test terminal portion formed at one side of the rail portion. The test terminal portion may comprise a plurality of test terminals, wherein the pair of via electrodes comprises a first via electrode arranged adjacent to the rail portion and electrically connected to a corresponding test terminal, and a second via electrode arranged adjacent to and electrically connected to the corresponding single PCB portion.

The corresponding test terminal and the first via electrode may be connected to each other via a first conductive pattern in the array PCB. The corresponding single PCB portion and the second via electrode may be connected to each other via a second conductive pattern in the array PCB.

The first conductive pattern and the second conductive pattern may be formed at the same level, measured from an upper surface of the array PCB.

The first conductive pattern may be a multi-layered pattern extending in the array PCB.

The first conductive pattern may comprise at least one via plug that connects individual patterns of the multi-layered pattern to each other.

At least one pattern of the first conductive pattern and the second conductive pattern may be formed at the same level measured from an upper surface of the array PCB.

The inventive concepts also provide a method of manufacturing an electronic apparatus using the array PCB.

According to another aspect of the inventive concepts, a method of replacing a defective single PCB portion of an array PCB is provided. The array PCB comprises a plurality of single PCB portions each having an electronic device mounting area formed on an upper surface thereof, a rail portion surrounding the plurality of single PCB portions, and a plurality of tab route portions for connecting the plurality of single PCB portions to the rail portion. Each tab route portion comprises a first via electrode arranged adjacent to the rail portion and a second via electrode arranged adjacent to a corresponding single PCB portion, wherein the first and second via electrodes extend from an upper surface of tab route portion toward an inside of the tab route portion. A test terminal portion is formed at one side of the rail portion, the test terminal portion comprising a plurality of test terminals. The method comprises separating a non-defective single PCB from the array PCB by cutting a non-defective single PCB portion of the plurality of single PCB portions, wherein the separated non-defective single PCB includes a portion of the tab route portion in which the second via electrode is formed. A defective single PCB portion is removed from among the plurality of single PCB portions of the array PCB. The separated non-defective single PCB is joined to the array PCB after removing the defective single PCB portion. A solder layer is formed for electrically connecting the first via electrode to the second via electrode. Removing the defective single PCB portion can comprise cutting along a line between the first via electrode and the second via electrode in a tab route portion connected to the defective single PCB portion.

A first conductive pattern, which extends through the rail portion to electrically connect the first via electrode to a test terminal of the test terminal portion, and a second conductive pattern, which is electrically connected to the second via electrode and extends to the corresponding single PCB portions, may each be formed in the array PCB.

Forming the solder layer may comprise electrically connecting the first conductive pattern to the second conductive pattern.

The array PCB may further comprise a first via pad and a second via pad, said first and second via pads being formed on an upper surface of a corresponding tab route portion and are connected to the first via electrode and the second via electrode, respectively.

Forming the solder layer may comprise forming the solder layer to extend from a surface of the first via pad to a surface of the second via pad.

Each of the plurality of single PCB portions may comprise a plurality of electronic device pad portions disposed in the electronic device mounting area. Forming the solder layer may comprise forming the solder layer on each of the plurality of electronic device pad portions.

According to another aspect of the inventive concepts, a method of manufacturing an electronic apparatus using an array PCB can be provided. The array PCB may comprise a plurality of single PCB portions each having an electronic device mounting area formed on an upper surface thereof, a rail portion surrounding the plurality of single PCB portions, and a plurality of tab route portions for connecting the plurality of single PCB portions to the rail portion. Each tab route portion may comprise a first via electrode arranged adjacent to the rail portion and a second via electrode arranged adjacent to a corresponding single PCB portion, wherein the first and second via electrodes extend from an upper surface of the each tab route portion toward an inside of the each tab route portion. A test terminal portion may be formed at one side of the rail portion, the test terminal portion comprising a plurality of test terminals. A first conductive pattern may extend through the rail portion to electrically connect the first via electrode to a test terminal of the test terminal portion. A second conductive pattern may be electrically connected to the second via electrode and extend to the corresponding single PCB portions. The method may include forming a solder layer for electrically connecting the first via electrode to the second via electrode, attaching electronic devices to the electronic device mounting area, and separating each of the plurality of single PCB portions from the array PCB.

Each of the plurality of single PCB portions may comprise a plurality of electronic device pad portions disposed in the electronic device mounting area. Forming the solder layer may comprise forming the solder layer on each of the plurality of electronic device pad portions. The method may further comprise performing a reflow process on the solder layer after attaching electronic devices.

A first via pad and a second via pad, which are connected to the first via electrode and the second via electrode, respectively, may be formed on an upper surface of a corresponding tab route portion. Forming the solder layer can comprise forming the solder layer to extend from a surface of the first via pad to a surface of the second via pad.

The method may further comprise testing, via the test terminal portion, the plurality of single PCB portions having the electronic devices attached thereto before separating of each of the plurality of single PCB portions.

Separating each of the plurality of single PCB portions may comprise separating each of the plurality of single PCB portions from a corresponding tab route portion connected thereto.

BRIEF DESCRIPTION OF THE DRAWINGS

Exemplary embodiments of the inventive concepts will be more clearly understood from the following detailed description, taken in conjunction with the accompanying drawings, in which:

FIGS. 2A through 2E are cross-sectional views of portions of the array PCB of FIG. 1, taken along a conductive pattern group of the array PCB, according to various embodiments of the inventive concepts;

FIG. 12 is a cross-sectional view taken along a conductive pattern group of an array PCB having an electronic device mounted thereon, according to an embodiment of the inventive concepts;

DETAILED DESCRIPTION OF THE EMBODIMENTS

Figure 1:
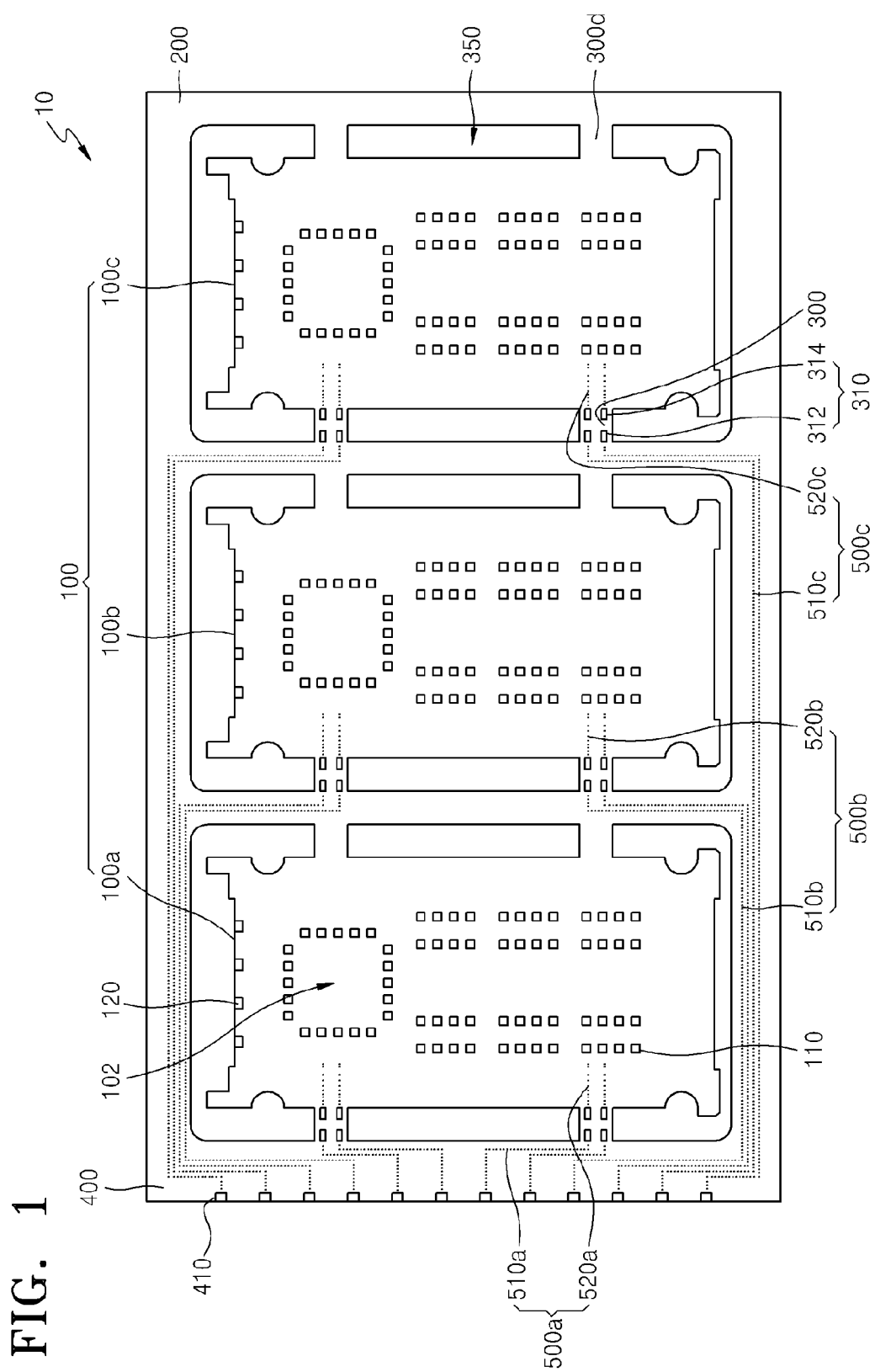
FIG. 1 is a plan view of an array printed circuit board (PCB) according to an embodiment of the inventive concepts.

Reference will now be made to exemplary embodiments, examples of which are illustrated in the accompanying drawings, to help one skilled in the art to understand the structure and principles of the inventive concepts. However, the inventive concepts are not limited to the embodiments illustrated hereinafter. Rather, the embodiments disclosed herein are introduced to provide an easy and complete understanding of the scope and spirit of the inventive concepts. In the drawings, the sizes and shapes of elements may be exaggerated for clarity, and the size ratios between the respective elements may be exaggerated, that is they may be greater or smaller than, their actual values.

It will be understood that when an element, such as a layer, a region, or a substrate, is referred to as being "on," "connected to" or "coupled to" another element, it may be directly on, connected or coupled to the other element or intervening elements may be present. In contrast, when an element is referred to as being "directly on,", "directly connected to", or "directly coupled to" another element or layer, there are no intervening elements or layers present. Other expressions, such as, "between" and "directly between", describing the relationship between the constituent elements, may be construed in the same manner.

Terms such as "first" and "second" are used herein merely to describe a variety of elements, but the elements are not to be limited by these terms. Rather, the terms are used only for the purpose of distinguishing one element from another element. For example, without departing from the scope of the inventive concepts, a first element may be referred to as a second element, and vice versa.

An expression of singularity, such as "a" or "an", in the present specification may also include a plurality, unless the context clearly indicates otherwise. Also, terms such as "include" or "comprise" may be construed to denote a certain characteristic, number, step, operation, element, or a combination thereof, but should not be construed to exclude the existence of, or the possible addition of, one or more other characteristics, numbers, steps, operations, elements, or combinations thereof.

Unless defined otherwise, all terms used herein, including technical or scientific terms, have the same meanings as those generally understood by those skilled in the art to which the inventive concepts pertain. As used herein, the term "and/or" includes any and all combinations of one or more of the associated listed items. Expressions such as "at least one of," when preceding a list of elements, modify the entire list of elements and do not modify the individual elements of the list.

Hereinafter, embodiments of the inventive concepts will be described in detail with reference to the accompanying drawings.

FIG. 1 is a plan view of an array printed circuit board (PCB) 10 according to an embodiment of the inventive concepts.

Referring to FIG. 1, the array PCB 10 includes a plurality of single PCB portions 100. The plurality of single PCB portions 100 may include, for example, first through third single PCB portions 100a, 100b, and 100c, respectively. Although the array PCB 10 of FIG. 1 includes three single PCB portions, the inventive concepts are not limited thereto. The array PCB 10 may, for instance, include two single PCB portions, or it may include four or more single PCB portions.

An array PCB is a PCB in which a plurality of single PCBs are connected to each other to form a larger array. In the present specification, each of the plurality of single PCB portions 100 denotes a single PCB connected to the array PCB 10, and the single PCB may be obtained by separating the plurality of single PCB portions 100 from the array PCB 10 to make an electronic apparatus.

The array PCB 10 further includes a rail portion 200 and a plurality of tab route portions 300. A rail is an area that includes extra PCB material added to sides of each of a plurality of single PCBs to make it easier to handle an array PCB during an assembly process. In this embodiment, the rail portion 200 is an extra area provided for connecting the plurality of single PCB portions 100 to each other in the array PCB 10. Although the rail portion 200 of FIG. 1 surrounds four sides of each of the plurality of single PCB portions 100, the inventive concepts are not limited thereto. In some cases, the rail portion 200 may be formed at only two sides of each of the plurality of single PCB portions 100. That is, the rail portion 200 may be formed so that it lies adjacent to only a portion of each of the plurality of single PCB portions 100.

A tab route is a small tab that allows a single PCB to be attached to another single PCB or a rail. In this embodiment, the plurality of tab route portions 300 are portions of the array PCB 10 which connect the rail portion 200 and the plurality of single PCB portions 100 together. Although the tab route portions 300 in FIG. 1 are only formed between the rail portion 200 and each of the plurality of single PCB portions 100, the inventive concepts are not limited thereto. For example, tab route portions 300 may be formed between adjacent single PCB portions 100. A tab route in which a via electrode 320 or 320a of FIGS. 2A through 2E is formed is referred to herein as a tab route portion 300, and a tab route in which the via electrode 320 or and 320a of FIGS. 2A through 2E is not formed is referred to herein as a dummy tab route portion 300d. The via electrode 320 or 320a of FIGS. 2A through 2E will described later. The dummy tab route portion 300d need not be formed. That is, all of the tab routes formed in the array PCB 10 may be the tab route portions 300, in which the via electrode 320 or 320a is formed, and the dummy tab route portions 300d may be omitted.

Thus, according to this embodiment, the array PCB 10 may include the plurality of single PCB portions 100, the rail portion 200 surrounding the plurality of single PCB portions 100, and the plurality of tab route portions 300 connecting the plurality of single PCB portions 100 to the rail portion 200.

Each of the single PCB portions 100 may include an electronic device mounting area 102 formed on an upper surface thereof, and a plurality of electronic device pads 110 may be arranged in the electronic device mounting area 102. If necessary, an electronic device mounting area and a plurality of electronic device pads may also be formed on a lower surface of each of the single PCB portions 100. An electronic device (not shown) may be attached to the electronic device mounting area 102 and electrically connected to the electronic device pads 110. A plurality of electronic apparatus terminals 120 may be formed on the upper surface of each of the single PCB portions 100. However, the inventive concepts are not limited thereto. For example, the electronic apparatus terminals 120 may be formed on the side, the upper surface, and the lower surface of each of the single PCB portions 100. Alternatively, the terminals 120 may be formed only on the side of each of the single PCB portions 100, or they may extend from the upper surface of each of the single PCB portions 100 to the lower surface of each of the single PCB portions 100 via the side of each of the single PCB portions 100. An electronic apparatus formed using the single PCB portion 100 may be electrically connected to the outside via the electronic apparatus terminals 120, and the electronic apparatus terminals 120 may be used for receiving a power supply voltage or for transmitting or receiving a signal.

A test terminal portion 400 may be formed having a plurality of test terminals 410 arranged in a portion of the rail portion 200, positioned at one edge of the array PCB 10. The test terminal portion 400 may be an independent portion connected to the rail portion 200. Alternatively, the test terminal portion 400 may be a portion of the rail portion 200 in which the test terminals 410 are formed. Although the test terminal portion 400 of FIG. 1 is formed only in a portion of the rail portion 200, the inventive concepts are not limited thereto. For example, the test terminal portion 400 may be formed in two or more portions of the rail portion 200, positioned, for example, at opposite edges of the array PCB 100. The test terminal portion 400 may, for instance, include four portions of the rail portion 200, which are positioned at each of the four edges of the array PCB 100. Or, the test terminal portion 400 may be formed anywhere in the rail portion 200. That is, where the test terminal portion 400 is provided as part of the rail portion 200, all portions of the rail portion 200, in which the test terminals 410 may be formed, may correspond to the test terminal portion 400.

Although the test terminals 400 may be formed on an upper surface of the test terminal portion 400, the inventive concepts are not limited thereto. For example, the test terminals 400 may be formed on the upper surface and a lower surface of the test terminal portion 400. Alternatively, they may be formed on a side of the test terminal portion 400, or may extend from the upper surface of the test terminal portion 400 to the lower surface of the test terminal portion 400 along the side of the test terminal portion 400.

The array PCB 10, which includes the single PCB portions 100, the rail portion 200, the tab route portions 300, and the test terminal portion 400, may be formed as a single large PCB. Separation spaces 350 may be formed between each of the single PCB portions 100 and the rail portion 200. The separation spaces 350 may be formed, for instance, by removing portions of the PCB material surrounding the single PCB portions 100 in the single large PCB, i.e., the array PCB 10. The separation spaces 350 may be formed so as to permit the single PCB portions 100 to be easily separated from each other in a subsequent process. The tab route portions 300 and the dummy tab route portions 300d may be portions of the PCB material that remain connected between the single PCB portions 100 when other portions are removed to form the separation spaces 350. The separation spaces 350 need not be formed in all cases. Where separation spaces 350 are not formed, all portions of the large PCB arranged surrounding the single PCB portions 100, in which the via electrode 320 or 320a is not formed, may correspond to the dummy tab route portions 300d.

As shown in FIGS. 2A through 2E, the array PCB 10 may include a plurality of insulating layers 12 and a plurality of conductive material layers 14c arranged at a plurality of layers 14a, 14b which are separated from each other by the plurality of insulating layers 12.

That is, the array PCB 10 may be formed by stacking a number of thin insulating substrates 12, and may further include wiring patterns 14c, which are formed between the thin insulating substrates 12 and on the upper and lower surfaces of the array PCB 10. Via electrodes 150, 322, 324, 420 penetrate the thin insulating substrates 12 and electrically connect the wiring patterns 14c to each other.

The wiring patterns 14c, which are formed between the thin insulating substrates 12 and on the upper and lower surfaces of the array PCB 10, may constitute the plurality of conductive material layers 14 that are arranged at the layers 14a, 14b and are separated from each other by the thin insulating substrates 12. For example, when the array PCB 10 is formed of seven thin insulating substrates 12 (as shown in FIGS. 2A through 2E), the wiring patterns 14c may be arranged at eight layers 14, which includes six interior layers 14a (arranged between pairs of the thin insulating substrates 12) and two external layers 14b (arranged on the upper and lower surfaces of the array PCB 10). The inside of the array PCB 10 may denote a portion of the PCB 10 disposed between the upper surface of the array PCB 10 and the lower surface of the array PCB 10. A wiring pattern (or a conductive pattern) extending in the array PCB 10 may denote a wiring pattern (or a conductive pattern) extending between two of the thin insulating substrates 12 forming the array PCB 10. For example, when the array PCB 10 is formed of seven thin insulating substrates 12, the wiring patterns (or conductive patterns) 14c extending in the array PCB 10 may denote a wiring pattern (or a conductive pattern) 14c extending to form at least one of the six layers 14b arranged between the seven thin insulating substrates 12 forming the array PCB 10.

Figure 3:
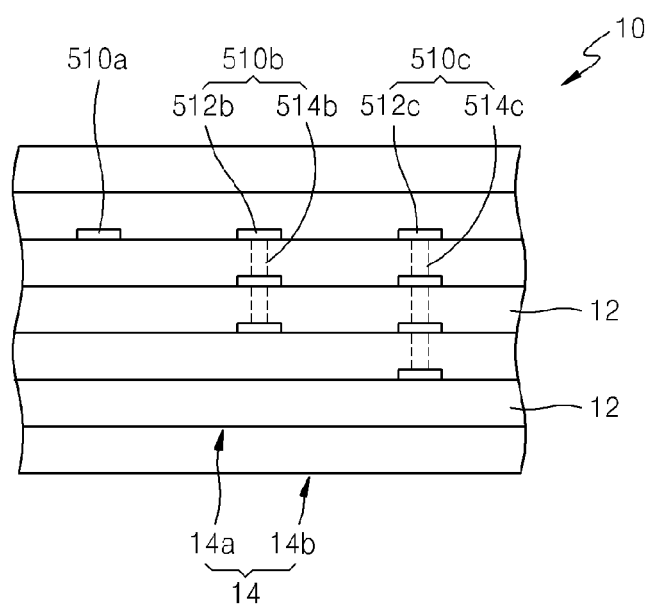
FIG. 3 is a cross-sectional view of first conductive patterns of an array PCB according to an embodiment of the inventive concepts.

Referring additionally to FIG. 3, first conductive patterns 510a, 510b, and 510c, extending from the test terminal portion 400 to the tab route portions 300 through the rail portion 200, may be formed in the array PCB 10. The first conductive patterns 510a, 510b, and 510c may extend through the inside of the array PCB 10. The first conductive patterns 510a, 510b, and 510c may extend along the same layer in the array PCB 10. Alternatively, the first conductive patterns 510a, 510b, and 510c may be multi-layered patterns extending to form a plurality of layers in the array PCB 10. Each of the first conductive patterns 510a, 510b, and 510c may be electrically connected to at least one test terminal 410 in the test terminal portion 400.

At least one pair of via pads 310 may be formed on the upper surface of each of the tab route portions 300. One pair of via pads 310 may be formed of a first via pad 312 and a second via pad 314. Although, as shown in FIG. 1, two pairs of via pads 310 (i.e., two first via pads 312 and two second via pads 314) may be formed on the upper surface of each tab route portion 300, the inventive concepts are not limited thereto. Alternatively, for instance, only one first via pad 312 and one second via pad 314 may be formed on the upper surface of one tab route portion 300, or three or more first via pads 312 and three or more second via pads 314 may be formed on the upper surface of one tab route portion 300. Although the number of via pads arranged on the tab route portion 300 may vary, the number of first via pads 312 and second via pads 314 that are formed on the upper surface of one tab route portion 300 may be the same.

The first via pad 312 and the second via pad 314 may be arranged adjacent to the rail portion 200 and the single PCB portion 100, respectively, on the upper surface of the tab route portion 300. That is, the first via pad 312 may be located adjacent to the rail portion 200, and the second via pad 314 may be arranged adjacent to the single PCB portion 100. Although the first via pad 312 and the second via pad 314, which form the pair of via pads 310, are shown in the drawings as have the same planar shape, the inventive concepts are not limited thereto. For example, the first via pad 312 may have a planar shape having a relatively large area and the second via pad 414 may have a planar shape having a relatively small area, and vice versa. When two or more pairs of via pads 310 are formed on the upper surface of one tab route portion 300, a first via pad 312 of one pair of via pads 310 may have a planar shape having an area larger than that of a second via pad 314 of that pair, and a second via pad 314 of another pair of via pads 310 may have a planar shape having an area larger than that of a first via pad 312 in that pair of via pads 310.

The first via pad 312 may be electrically connected to any one of the first conductive patterns 510a, 510b, and 510c. That is, one first via pad 312 formed on the upper surface of one tab route portion 300 may be electrically connected to at least one of the first conductive patterns 510a, 510b, and 510c, which extend from the test terminal portion 400 to a corresponding tab route portion 300.

Second conductive patterns 520a, 520b, and 520c, extending from the tab route portions 300 to the single PCB portions 100, may be formed in the array PCB 10. The second conductive patterns 520a, 520b, and 520c may extend through the inside of the array PCB 10. The second conductive patterns 520a, 520b, and 520c may extend along the same layer in the array PCB 10.

The second via pad 314 may be electrically connected to any one of the second conductive patterns 520a, 520b, and 520c. That is, one second via pad 314 formed on the upper surface of one of the tab route portions 300 may be electrically connected to at least one of the second conductive patterns 520a, 520b, and 520c, which extends from the corresponding tab route portion 300 to a corresponding single PCB portion 100.

In FIG. 1, paths of the first conductive patterns 510a, 510b, and 510c and paths of the second conductive patterns 520a, 520b, and 520c are schematically illustrated by dotted lines. The first conductive patterns 510a, 510b, and 510c and the second conductive patterns 520a, 520b, and 520c may, for instance, extend through the inside of the array PCB 10 or along the upper surface of the array PCB 10.

The paths of the second conductive patterns 520a, 520b, and 520c in the single PCB portions 100a, 100b, and 100c, respectively, may be variously formed depending on the desired tests for the single PCB portions 100a, 100b, and 100c, which are described below. Thus, the paths of the second conductive patterns 520a, 520b, and 520c may extend from the tab route portions 300 to the single PCB portions 100 and may be variously formed without restriction in the single PCB portions 100. In the drawings, detailed paths of the second conductive patterns 520a, 520b, and 520c are omitted in the single PCB portions 100a, 100b, and 100c. And the inventive concepts are not limited to any specific path of the second conductive patterns.

The first conductive pattern 510a and the second conductive pattern 520a, which are formed from the test terminal portion 400 to the first single PCB portion 100a, may be referred to as a first conductive pattern group 500a. The first conductive pattern 510b and the second conductive pattern 520b, which are formed from the test terminal portion 400 to the second single PCB portion 100b, may be referred to as a second conductive pattern group 500b. The first conductive pattern 510c and the second conductive pattern 520c, which are formed from the test terminal portion 400 to the third single PCB portion 100c, may be referred to as a third conductive pattern group 500c. The first conductive pattern 510a and the second conductive pattern 520a, which form the first conductive pattern group 500a, may be separated from each other or may be connected to each other in a corresponding tab route portion 300. The first conductive pattern 510b and the second conductive pattern 520b, which form the second conductive pattern group 500b, may be separated from each other or may be connected to each other in a corresponding tab route portion 300. The first conductive pattern 510c and the second conductive pattern 520c, which form the third conductive pattern group 500c, may be separated from each other or may be connected to each other in a corresponding tab route portion 300.

FIGS. 2A through 2E are cross-sectional views taken along a conductive pattern group of the array PCB 10 of FIG. 1, according to embodiments of the inventive concepts. Conductive pattern groups 500 shown in FIGS. 2A through 2E may provide some or all of the conductive pattern groups 500a, 500b, and 500c shown in FIG. 1. Thus, although the conductive pattern groups 500 shown in FIGS. 2A through 2E have different shapes, they are all described using the same reference numeral 500. In addition, a single PCB portion 100 shown in each of FIGS. 2A through 2E may represent some or all of the single PCB portions 100a, 100b, and 100c, of FIG. 1. For example, the conductive pattern group 500 and the single PCB portion 100 shown in each of FIGS. 2A through 2E may represent a cross-sectional view taken along any one of the conductive pattern groups 500a, 500b, and 500c shown in FIG. 1, which are connected to a corresponding one of the single PCB portions 100a, 100b, and 100c.

Referring now specifically to FIGS. 2A through 2E, the array PCB 10 may include a plurality of insulating layers 12 and conductive material layers 14c (including 110, 140, 310, 410, and 500) arranged along a plurality of layers 14 which are separated from each other by the plurality of insulating layers 12. The plurality of layers 14 may include inner layers 14a located between adjacent ones of the plurality of insulating layers 12 and outer layers 14b arranged on the upper and lower surfaces of the array PCB 10. That is, the array PCB 10 may be formed by attaching the plurality of insulating layers 12 to each other, and the conductive material layers 14c (including 110, 140, 310, 410, and 500) may be formed along the inner layers 14a between the plurality of insulating layers 12 and on the outer layers 14b that correspond to the upper surface of the uppermost insulating layer 12 and the lower surface of the lowermost insulating layer 12. The conductive material layers 14c may include an electronic device pad 110 formed on the upper surface or lower surface of the single PCB portion 100, a via pad 310 formed on the upper surface of a tab route portion 300, a test terminal 410 formed in a test terminal portion 400, along with a wiring pattern 140 and a conductive pattern group 500 which are formed along one or more inner layers 14a of the single PCB portion 100.

For example, when the array PCB 10 includes seven insulating layers 12, as illustrated here, the conductive material layers 14c may be formed along any of six inner layers 14a, disposed between adjacent ones of the seven insulating layers 12, or on either of the two outer layers 14b that correspond to the upper surface of the uppermost insulating layer 12 and the lower surface of the lowermost insulating layer 12. However, the inventive concepts are not limited thereto. For example, the array PCB 10 may be formed by attaching two or more insulating layers 12 to each other. In this case, the array PCB 10 may include conductive material layers 14c arranged in three or more layers 14 that include one or more inner layers 14a and two outer layers 14b.

Each of the insulating layers 12 may be formed of an insulating material. For example, the insulating material may be a rigid material, such as Bismaleimide-Triazine (BT) or Flame Retardant 4 (FR4), or a flexible material such as PolyImide (PI) or Polyester (PET).

The conductive material layers 14c may be formed of copper (Cu) or a metal material including Cu. Also, the conductive material layers 14c may be formed by partially plating a material such as nickel (Ni) or gold (Au) on a pattern formed of Cu or a metal material including Cu. The electronic device pad 110, the via pad 310, and the test terminal 410, may each be a portion that is exposed by a solder resist layer (not shown) from among conductive material layers formed on the outer layers 14b of the array PCB 10.

The array PCB 10 may further include through vias (i.e., 420, 320, and 150) that connect conductive material layers 14c arranged along different layers to each other. The through vias may, for example, include a test via electrode 420 for electrically connecting a first conductive pattern 510 to the test terminal 410, a via electrode 320 for electrically connecting the conductive pattern group 500 to the via pad 310, and a wiring via electrode 150 for electrically connecting wiring patterns 140 arranged at different layers or for electrically connecting a wiring pattern 140 to one or more of the electronic device pads 110. That is, the through vias 420, 320, and 150 may electrically connect conductive material layers arranged at different layers in the array PCB 10.

The array PCB 10, including the plurality of insulating layers 12, conductive material layers 14c, and through vias 420, 320, and 150, may be formed using a general multi-layer PCB manufacturing method. A detailed description of a manufacturing method will therefore be omitted.

The plurality of insulating layers 12, the electronic device pad 110, the wiring pattern 140, and the wiring via electrode 150 connecting the electronic device pad 110 to the wiring pattern 140 may be formed in the single PCB portion 100. As described above, the electronic device pad 110 and the wiring pattern 140 may be different conductive material layers 14c arranged at different layers 14 in the PCB, and which are separated from each other by one or more of the plurality of insulating layers 12. The wiring via electrode 150 electrically connects the different conductive material layers 14c (i.e., the electronic device pad 110 and the wiring pattern 140) arranged along different layers 14 to each other. The connection relationship among the electronic device pad 110, the wiring pattern 140, and the wiring via electrode 150 described above is only an example, however, and the inventive concepts are not limited thereto. For example, the connection relationship between the electronic device pad 110 and the wiring pattern 140 may be modified according to a configuration and design of an electronic device to be formed using the single PCB portion 100.

Although the second conductive pattern 520 of the conductive pattern group 500 shown here extends from the tab route portion 300 to a lower portion of the electronic device pad 110 of the single PCB portion 100, the inventive concepts are not limited thereto. The second conductive pattern 520 may extend to the lower portion of the electronic device pad 110, or may extend to a portion that is different from the lower portion of the electronic device pad 110. Although, in FIGS. 2A through 2E, the connection relationship between the second conductive pattern 520 and the electronic device pad 110 is not illustrated, the second conductive pattern 520 and the electronic device pad 110 may be connected to each other through a wiring pattern 140 and a wiring via electrode 150, which may be formed in other portions of the single PCB portion 100. Alternatively, they may not be connected to each other at all. For example, some of the plurality of electronic device pads 110 may be electrically connected to the second conductive pattern 520 in the single PCB portion 100. Some of the plurality of electronic device pads 110 may not be electrically connected to the second conductive pattern 520 in the single PCB portion 100. The connection relationship between the second conductive pattern 520 and the electronic device pad 110 or the connection relationship between the conductive pattern 520 and the wiring pattern 140 may be modified according to the type and method of testing an electronic device to be formed using the single PCB portion 100.

The conductive pattern group 500 of the array PCB 100 will now be described in greater detail with reference to FIGS. 2A through 2E.

Figure 2A:
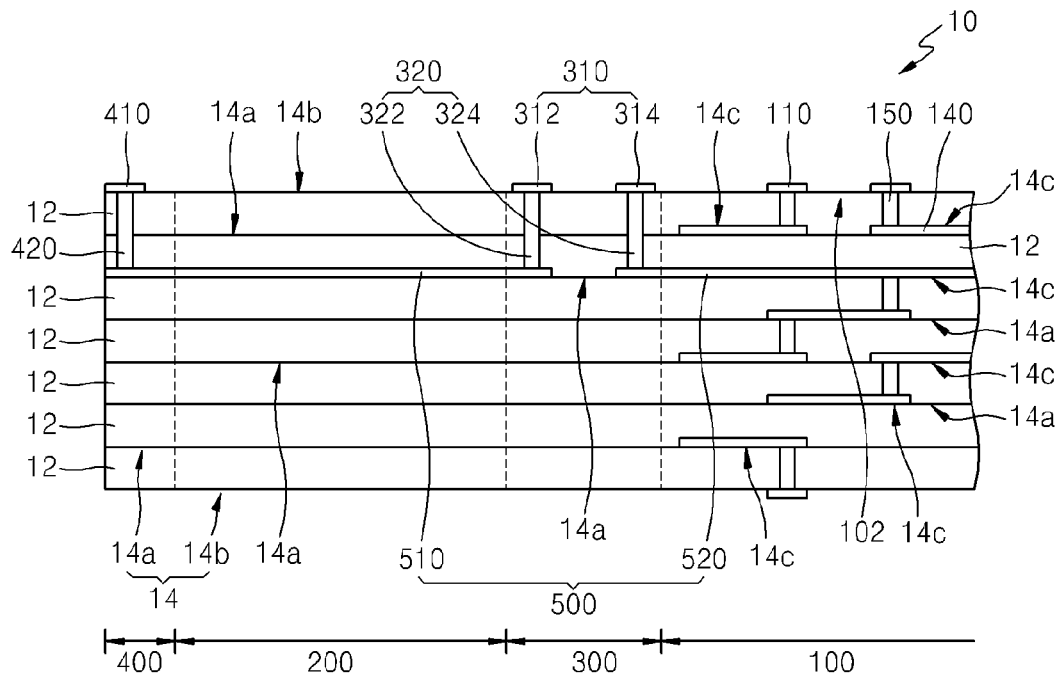

Referring to FIG. 2A, the conductive pattern group 500 may include a first conductive pattern 510 and a second conductive pattern 520.

The tab route portion 300 may include a pair of via electrodes 320 extending from the upper surface of the tab route portion 300 toward the inside of the tab route portion 300, and may connect the rail portion 200 and the single PCB portion 100. The pair of via electrodes 320 may include a first via electrode 322 located adjacent to the rail portion 200 and a second via electrode 324 located adjacent to the single PCB portion 100. The via pad 310, which is formed of a first via pad 312 and a second via pad 314, may be formed on the upper surface of the tab route portion 300. The first via pad 312 and the second via pad 314 may be electrically connected to the first via electrode 322 and the second via electrode 324, respectively. The first via pad 312 and the second via pad 314 may be formed separately from the first via electrode 322 and the second via electrode 324. Alternatively, however, the first via pad 312 and the second via pad 314 may comprise a portion of the first via electrode 322 and a portion of the second via electrode 324, respectively, which are exposed on the upper surface of the tab route portion 300.

The first conductive pattern 510 may electrically connect the test terminal 410 of the test terminal portion 400 to the first via pad 312. The second conductive pattern 520 may be electrically connected to the second via pad 314, and may extend to the single PCB portion 100. The first conductive pattern 510 and the second conductive pattern 520 may extend through the inside of the array PCB 10 along the same level, measured from the upper surface of the array PCB 10.

As described above, the array PCB 10 may include the single PCB portion 100, the rail portion 200, the tab route portion 300, and the test terminal portion 400, and may be formed of the plurality of insulating layers 12 and the conductive material layers 14c arranged on a plurality of layers 14 that are separated from each other by the plurality of insulating layers 12. The first conductive pattern 510 and the second conductive pattern 520 may provide some of the conductive material layers 14c and may be formed along the same inner layer 14a as each other. The first conductive pattern 510 and the second conductive pattern 520 may be spaced apart from each other in the tab route portion 300. The first conductive pattern 510 and the second conductive pattern 520 may also be spaced apart from each other along an inner layer 14a at the same level of the tab route portion 300.

The first via electrode 322 may extend from the upper surface of the tab route portion 300 to the first conductive pattern 510. The second via electrode 324 may extend from the upper surface of the tab route portion 300 to the second conductive pattern 520.

As shown in FIG. 2A, the first conductive pattern 510 and the second conductive pattern 520 may be electrically insulated from each other. That is, the test terminal 410 and the single PCB portion 100 may be electrically insulated from each other.

Figure 2B:
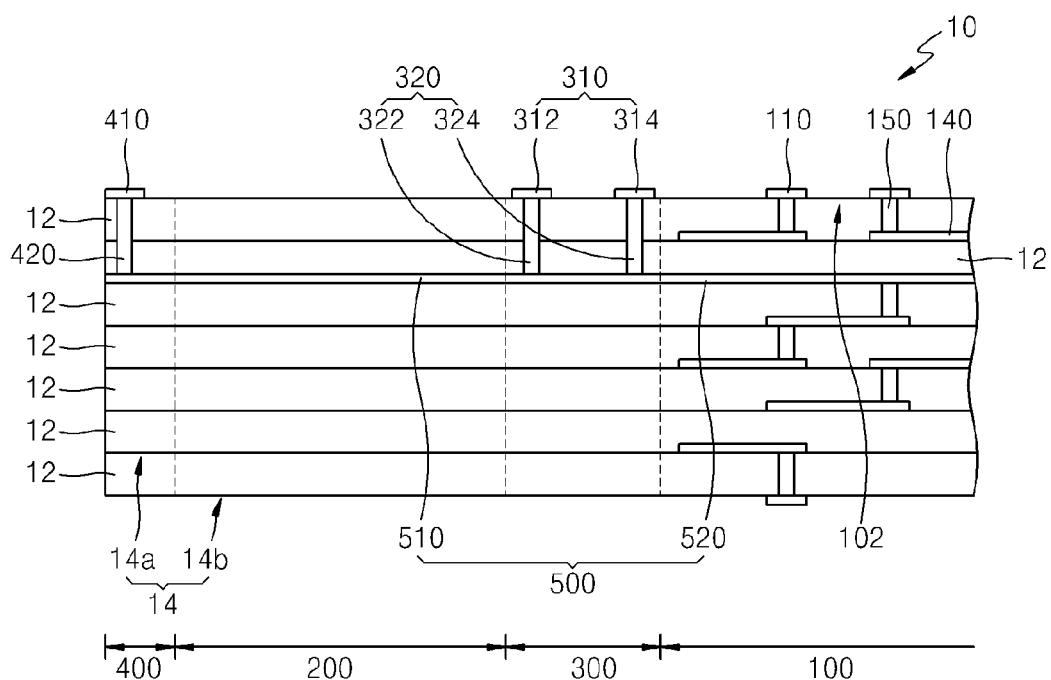

Referring to FIG. 2B, the first conductive pattern 510 and the second conductive pattern 520 may be connected to each other in the tab route portion 300. More particularly, the first conductive pattern 510 and the second conductive pattern 520 may be arranged at the same level from the upper surface of the array PCB 10 and may extend so as to be connected to each other through the inside of the array PCB 10.

In FIG. 2B, the first conductive pattern 510 and the second conductive pattern 520 may be electrically connected to each other. That is, the test terminal 410 and the single PCB portion 100 may be electrically connected to each other.

As illustrated, the first conductive pattern 510 and the second conductive pattern 520 in the array PCB 10 of FIG. 2A are separated from each other in the tab route portion 300, whereas the first conductive pattern 510 and the second conductive pattern 520 in the array PCB 10 of FIG. 2B are connected to each other in the tab route portion 300. Aside from this difference, the array PCB 10 of FIG. 2B is substantially the same as the array PCB 10 of FIG. 2A and a more detailed description of the array PCB 10 of FIG. 2B will therefore be omitted.

Referring to FIG. 2C, a via electrode 320a may extend so as to penetrate the conductive pattern group 500 from the upper surface of the tab route portion 300 to the lower surface thereof. More specifically, a first via electrode 322a may extend so as to penetrate the first conductive pattern 510 from the upper surface of the tab route portion 300 to the lower surface thereof. A second via electrode 324a may extend so as to penetrate the second conductive pattern 520 from the upper surface of the tab route portion 300 to the lower surface thereof. Although, in FIG. 2C, the first via electrode 322a and the second via electrode 324a are shown to extend from the upper surface of the tab route portion 300 to the lower surface thereof, the inventive concepts are not limited thereto. For example, the first via electrode 322a and the second via electrode 324a may extend from the upper surface of the tab route portion 300 toward the lower surface of the tab route portion 300 to penetrate the first conductive pattern 510 and the second conductive pattern 520, respectively, but may not extend all the way to the lower surface of the tab route portion 300.

Comparing FIG. 2A and FIG. 2C, the via electrode 320 in the array PCB 10 of FIG. 2A extends from the upper surface of the tab route portion 300 to the conductive pattern group 500, whereas the via electrode 320a in the array PCB 10 of FIG. 2C extends from the upper surface of the tab route portion 300 to the lower surface of the tab route portion 300 and penetrates the conductive pattern group 500. Aside from this difference, the array PCB 10 of FIG. 2C is substantially the same as the array PCB 10 of FIG. 2A, and a more detailed description of the array PCB 10 of FIG. 2C will therefore be omitted.

In addition, although in FIG. 2B, the via electrode 320 extends from the upper surface of the tab route portion 300 to the conductive pattern group 500, the via electrode 320 may be formed similar to that illustrated in FIG. 2C to extend from the upper surface of the tab route portion 300 to the lower surface of the tab route portion 300, penetrating the conductive pattern group 500.

Referring to FIG. 2D, a first conductive pattern 510 may be a multi-layered pattern extending along multiple layers in the array PCB 10. The first conductive pattern 510 may, for example, include a plurality of single layer conductive patterns 512 and a plurality of via plugs 514. The plurality of single layer conductive patterns 512 may be formed along different inner layers 14a, and the plurality of via plugs 514 may electrically connect the plurality of single layer conductive patterns 512 (i.e., multilayer patterns forming the first conductive pattern 510) to each other.

Although the first conductive pattern 510 is shown in FIG. 2D as being formed of four single layer conductive patterns 512, the inventive concepts are not limited thereto. For example, the first conductive pattern 510 may be formed of two, three, five, or more single layer conductive patterns 512.

One of the plurality of single layer conductive patterns 512 forming the first conductive pattern 510 (i.e., a pattern formed along one of the layers from among the multilayer pattern) and a second conductive pattern 520 may be formed along a single one of inner layers 14a of the array PCB 10, arranged at the same level from the surface of the array PCB 10.

Comparing FIG. 2A and FIG. 2D, the first conductive pattern 510 in the array PCB 10 of FIG. 2A is a single-layered pattern formed along one inner layer 14a, whereas the first conductive pattern 510 in the array PCB 10 of FIG. 2D is a multi-layered pattern formed along different inner layers 14a. Aside from this different, the array PCB 10 of FIG. 2D is substantially the same as the array PCB 10 of FIG. 2A and a more detailed description of the array PCB 10 of FIG. 2D will therefore be omitted.

Figure 2E:
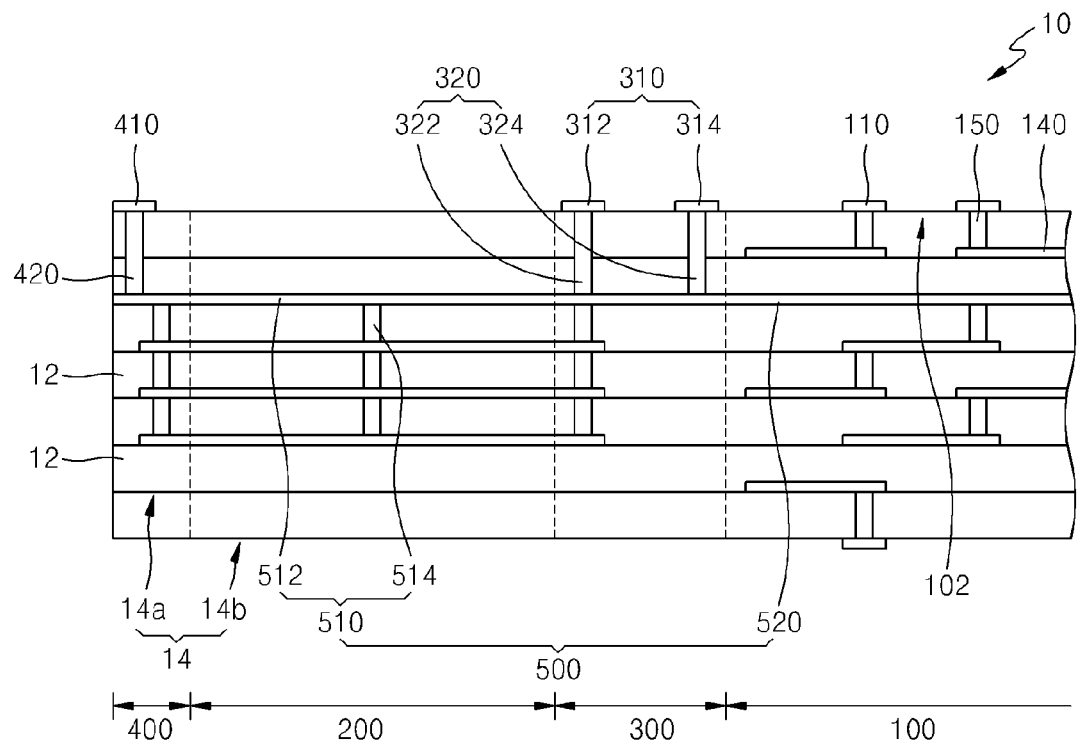

Referring now to FIG. 2E, one of a plurality of single layer conductive patterns 512 that is combined with others to form a first conductive pattern 510 (i.e., a pattern formed along one layer from among the multilayer pattern of the first conductive pattern 510) and a second conductive pattern 520 may be formed along a same one of inner layers 14a of the array PCB 10 at the same level from the surface of the array PCB 10. The single pattern of the first conductive pattern 510 and the second conductive pattern 520 may be connected to each other in the tab route portion 300.

In the array PCB 10 of FIG. 2D, the pattern formed from among the multilayer pattern of the first conductive pattern 510 and the second conductive pattern 520 are separated from each other in the tab route portion 300. On the other hand, in the array PCB 10 of FIG. 2E, the pattern formed from among the multilayer pattern of the first conductive pattern 510 and the second conductive pattern 520 are connected to each other in the tab route portion 300. Aside from this difference, the array PCB 10 of FIG. 2E is substantially the same as the array PCB 10 of FIG. 2D and a more detailed description of the array PCB 10 of FIG. 2E will therefore be omitted.

Although not illustrated, the multilayer pattern providing the first conductive pattern 510 (as shown in FIG. 2D), may also be applied to the array PCB 10 of FIG. 2C.

FIG. 3 is a cross-sectional view of the array PCB 10 of FIG. 1, illustrating first conductive patterns 510a, 510b, and 510c according to an embodiment of the inventive concepts.

Referring to FIGS. 1 and 3, the array PCB 10 may include the plurality of first conductive patterns 510a, 510b, and 510c formed therein. The plurality of first conductive patterns 510a, 510b, and 510c may extend to tab route portions 300, which are connected to at least two of the single PCB portions 100a, 100b, and 100c. The number of layers of patterns forming each of the first conductive patterns 510a, 510b, and 510c, may be different from each other. The first conductive pattern 510b may include a single-layer conductive pattern 512b and a via plug 514b and the first conductive pattern 510c may include a single-layer conductive pattern 512c and a via plug 514c.

For example, the first conductive pattern 510a, which extends to a tab route portion 300 connected to the first single PCB portion 100a, may be a single layer pattern. The first conductive pattern 510b, which extends to a tab route portion 300 connected to the second single PCB portion 100b, and the first conductive pattern 510c, which extends to a tab route portion 300 connected to the third PCB portion 100c, may, for example, be multilayer patterns.

A length of the first conductive pattern 510a extending from the test pattern terminal 400 to the tab route portion 300 connected to the first single PCB portion 100a, a length of the first conductive pattern 510b extending from the test pattern terminal 400 to the tab route portion 300 connected to the second single PCB portion 100b, and a length of the first conductive pattern 510c extending from the test pattern terminal 400 to the tab route portion 300 connected to the third single PCB portion 100c may be different from each other. Resistances of the first conductive patterns 510a, 510b, and 510c may also be different from each other depending on the length of the pattern. Differences between the resistances of each of the first conductive patterns 510a, 510b, and 510c may be minimized by making the number of layers of patterns forming the first conductive patterns 510a, 510b, and 510c different from each other. The number of layers for each pattern can be selected based upon the respective lengths of the first conductive patterns 510a, 510b, and 510c.

Although the number of layers of patterns forming the first conductive patterns 510a, 510b, and 510c are shown different from each other in FIG. 3, the inventive concepts are not limited thereto. Depending on the arrangement of the single PCB portions 100a, 100b, and 100c included in the array PCB 10, and on a permissible resistance margin for testing the single PCB portions 100a, 100b, and 100c, some of the plurality of first conductive patterns 510a, 510b, and 510c may have an equal number of pattern layers, while some of the plurality of first conductive patterns 510a, 510b, and 510c may have a different number of pattern layers. Alternatively, all of the plurality of first conductive patterns 510a, 510b, and 510c may have an equal number of pattern layers.

Figure 4A:
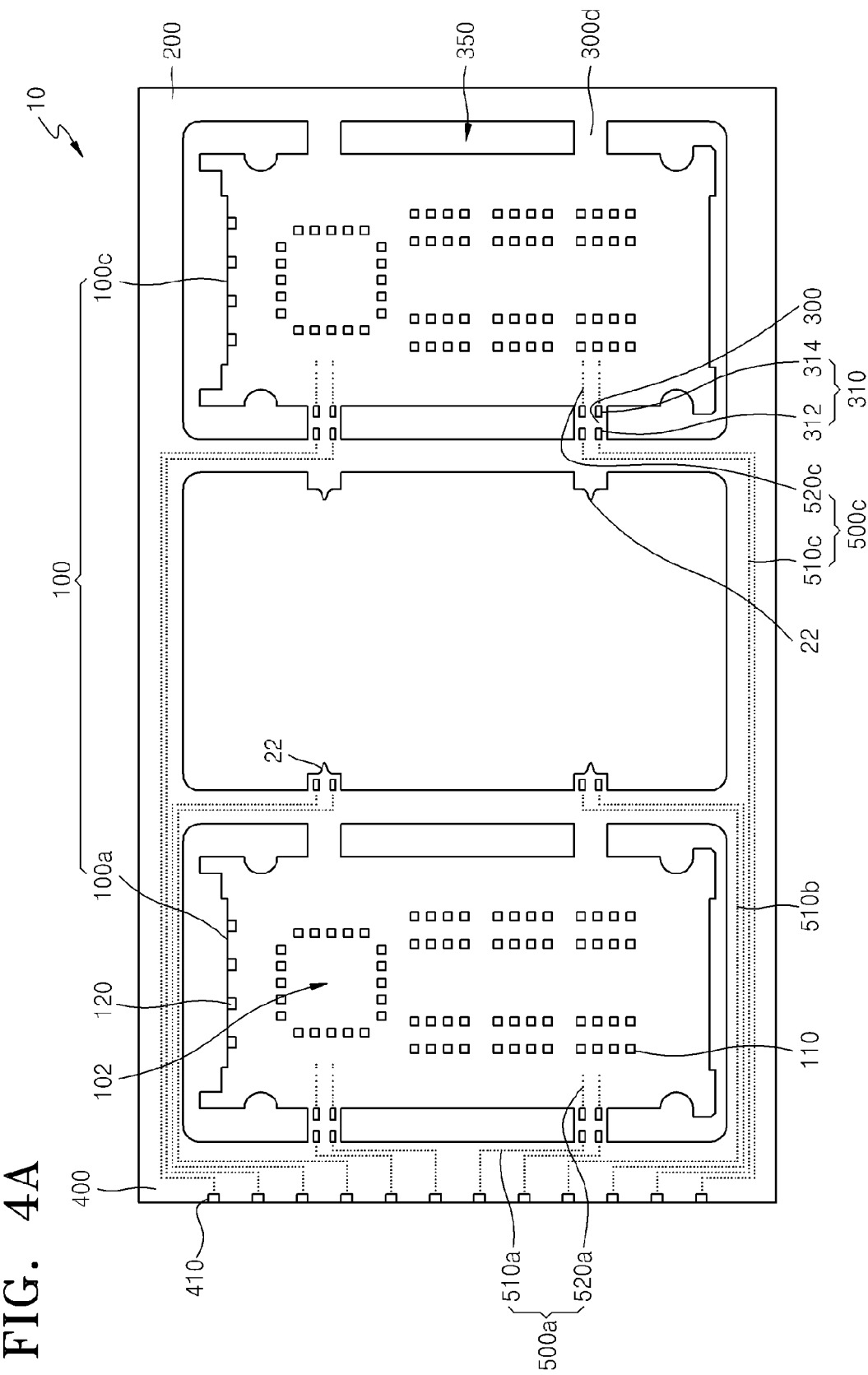
FIG. 4A is a plan view of an array PCB from which a single PCB portion has been removed, according to an embodiment of the inventive concepts.

FIG. 4A is a plan view of the array PCB 10 of FIG. 1, from which a single PCB portion has been removed, according to an embodiment of the inventive concepts.

Referring to FIG. 4A, one or more single PCB portions (in this case, the second single PCB portion 100b of in FIG. 1) may be removed from the array PCB 10. The removed single PCB portion may be a defective single PCB portion or a non-defective single PCB portion.

Figure 4B:
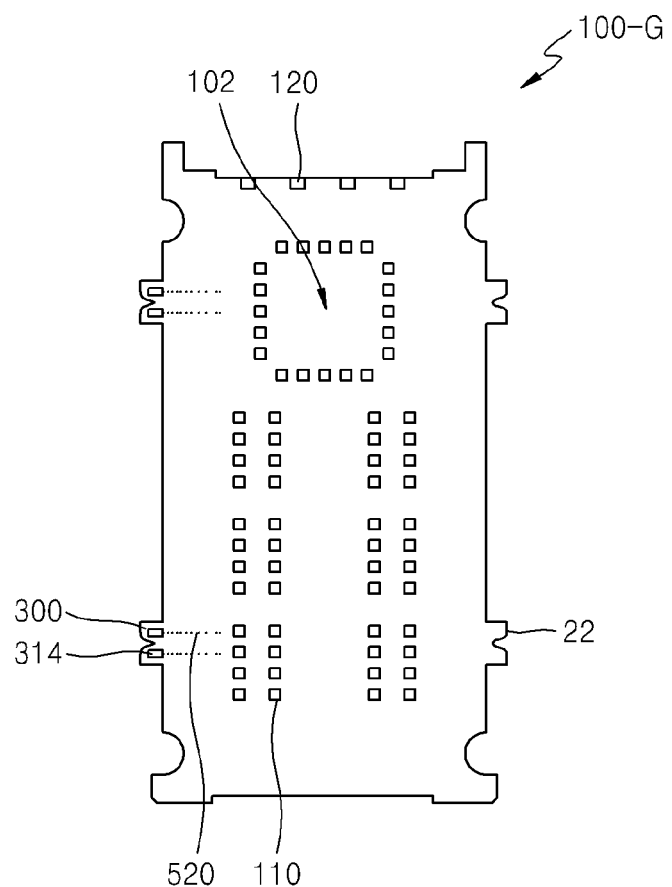
FIG. 4B is a plan view of a non-defective single PCB according to an embodiment of the inventive concepts.

FIG. 4B is a plan view of a non-defective single PCB 100-G according to an embodiment of the inventive concepts.

Referring to FIG. 4B, a non-defective single PCB portion (e.g., the second single PCB portion 100b) may be separated from the array PCB 10 shown in FIG. 1 to obtain the non-defective single PCB 100-G. A defective single PCB portion may be separated and removed from another array PCB 10, as illustrated in FIG. 4A. The exterior view of the defective single PCB is the same as or similar to that of the non-defective single PCB 100-G, and thus, the defective single PCB is not separately depicted in the drawings.

The defective single PCB portion may be any one of the single PCB portions of the array PCB 10 that does not pass a test performed by a manufacturer of the array PCB 10 and is marked as defective. The defective single PCB portion cannot be used in the manufacture of an electronic apparatus, and is therefore cut off and removed from the array PCB 10.

Figure 5A:
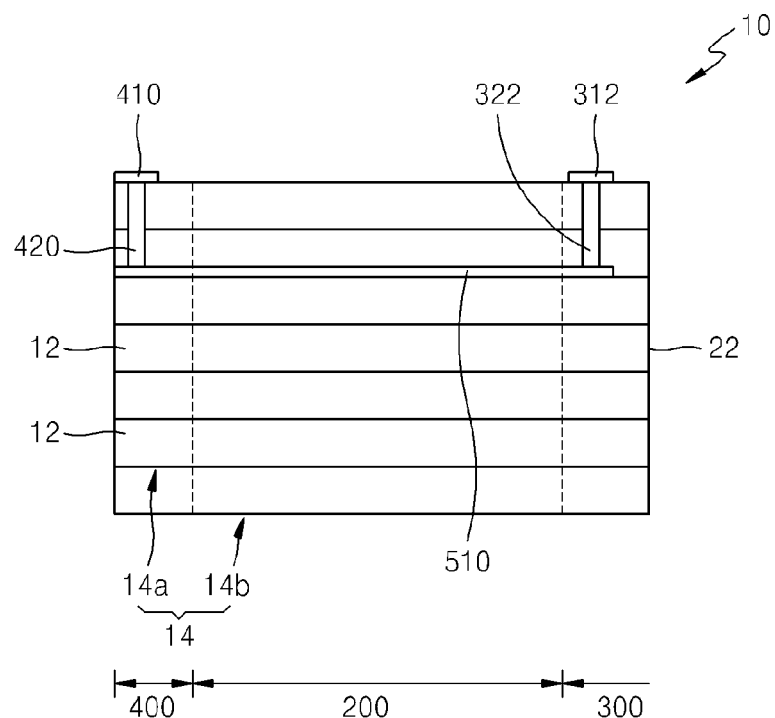
FIGS. 5A and 5B are cross-sectional views taken along a first conductive pattern of the array PCB of FIG. 4B, from which a defective single PCB portion has been removed, according to embodiments of the inventive concepts.
Figure 5B:
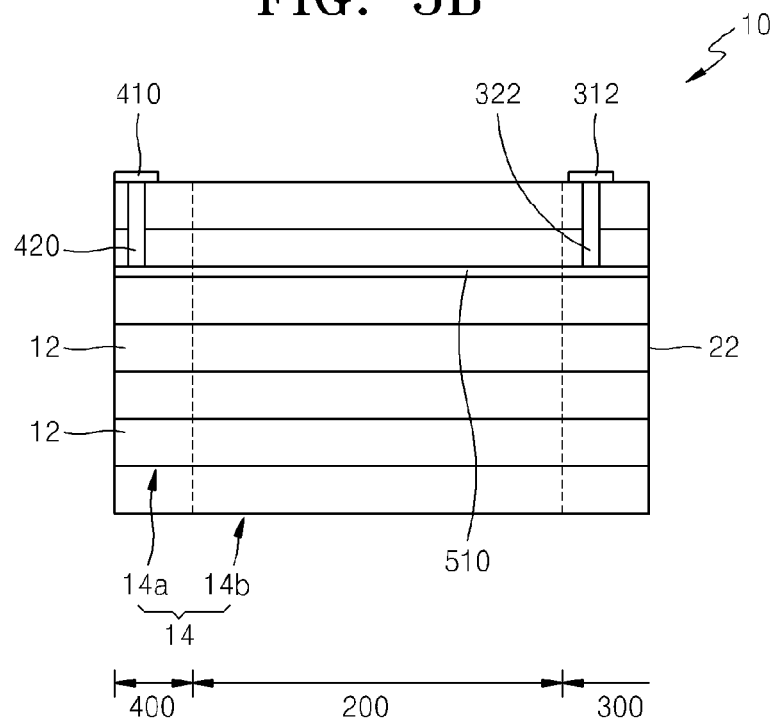

FIGS. 5A and 5B are cross-sectional views taken along a first conductive pattern of an array PCB 10 from which a defective single PCB portion has been removed, according to embodiments of the inventive concepts. FIG. 5A is a cross-sectional view illustrating the case in which a defective single PCB portion 100 has been removed from the array PCB 10 of FIG. 2A. FIG. 5B is a cross-sectional view illustrating the case in which a defective single PCB portion 100 has been removed from the array PCB 10 of FIG. 2B. The array PCB 10 shown in FIG. 2C, FIG. 2D, and FIG. 2E are each different from that shown in FIG. 2A or FIG. 2B only in the shape of the via electrode 320a and/or the shape of the first conductive pattern 510. More detailed descriptions thereof are therefore omitted. However, the shape of the via electrode 320a and/or the shape of the first conductive pattern 510, which are shown in FIGS. 2C, 2D, and 2E, may be applied to the embodiment shown in FIGS. 5A and 5B.

Referring to FIGS. 2A through 2E and 4A through 5B, in order to remove one or more single PCB portions 100 from the array PCB 10, tab route portions 300 and dummy tab route portions 300d, which are connected thereto, may be cut. For example, in order to remove the second single PCB portion 100b from the array PCB 10, cutting may be performed along a line between the first via electrodes 322 and the second via electrodes 324 in the tab route portions 300 connected to the second single PCB portion 100b. When the first via pad 312 and the second via pad 314 are formed on the upper surface of the tab route portion 300 that is connected to the second single PCB portion 100b, cutting may be performed along a line between the first via pad 312 and the second via pad 314 to remove the second single PCB portion 100b. For dummy tab route portions 300d, the dummy tab route portion 300d may be cut to remove the second single PCB portion 100b from the array PCB 10.

Thus, a portion of each cut tab route portion 300, in which the first via pad 312 and/or the first via electrode 322 were formed, may remain in the array PCB 10 after the second single PCB portion 100b is removed from the array PCB 10. A portion of the cut tab route portion 300, in which the second via pad 314 and/or the second via electrode 324 were formed, may also remain in the single PCB 100-G removed from the array PCB 10. The single PCB 100-G can be illustrated in cross-section in FIGS. 2A through 2E by removing the test terminal portion 400, the rail portion 200, and a portion of the tab route portion 300 in which the first via pad 312 and/or the first via electrode 322 were formed.

The second single PCB portion 100b may be removed from the array PCB 10 by cutting the tab route portions 300 and the dummy tab route portions 300, which are connected thereto, so that a cut surface 22 is a curved surface. In other words, the cut surface 22 may have a curved shape when viewed in plan view.

In a subsequent process, a non-defective single PCB 100-G may be joined to the array PCB 10 from which a defective single PCB portion 100 was removed. Thus, separation of a defective single PCB portion 100 from the array PCB 10 and separation of a non-defective single PCB portion 100 from the array PCB 10 may be selectively performed, as desired.

For example, when the number of defective single PCB portions 100 in the array PCB 10 is less than of the number of non-defective single PCB portions 100, the defective single PCB portions may be separated from the array PCB 10 to remove them. On the other hand, when the number of non-defective single PCB portions 100 in the array PCB 10 is less than the number of defective single PCB portions 100, the non-defective single PCB portions 100 may be separated from the array PCB 10 to obtain non-defective single PCBs 100-G. When there are a large number of array PCBs 10 from which defective single PCB portions 100 were have been removed, one or more non-defective single PCB portions 100 may be separated from an array PCB 10 that has many non-defective single PCB portions 100 to obtain a non-defective single PCB 100-G to be joined to an array PCB 10.

Figure 6:
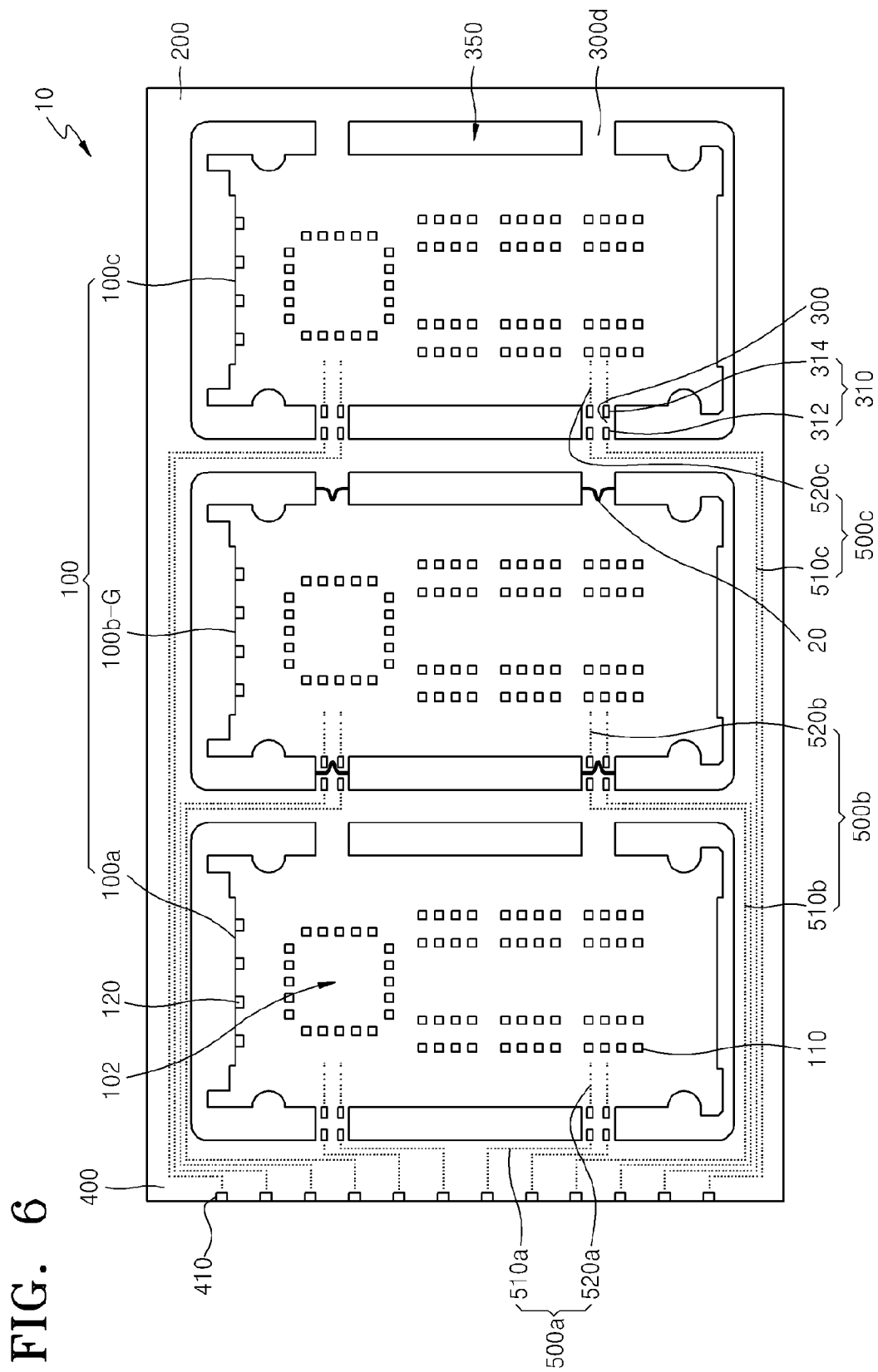
FIG. 6 is a plan view of an array PCB having a non-defective single PCB joined thereto, according to an embodiment of the inventive concepts.

FIG. 6 is a plan view of an array PCB 10 having a non-defective single PCB 100b-G joined to an area where a defective single PCB portion 100b was removed, according to an embodiment of the inventive concepts.

Referring to FIG. 6, a non-defective single PCB 100b-G may be joined to the array PCB 10 from which a defective single PCB portion 100b has been removed.

In order to join the non-defective single PCB 100b-G to the array PCB 10, a junction layer 20 may be formed between the non-defective single PCB 100b-G and the array PCB 10. In order to form the junction layer 20, insulating resin may be injected between the array PCB 10 and the non-defective single PCB 100b-G, and then may be hardened by applying energy, such as heat, thereto. When the cut surface 22 is a curved surface (as described with reference with FIGS. 4A through 5B), a contact area between the array PCB 10 and the non-defective single PCB 100b-G may be increased, thereby increasing a bonding strength therebetween.

Figure 7A:
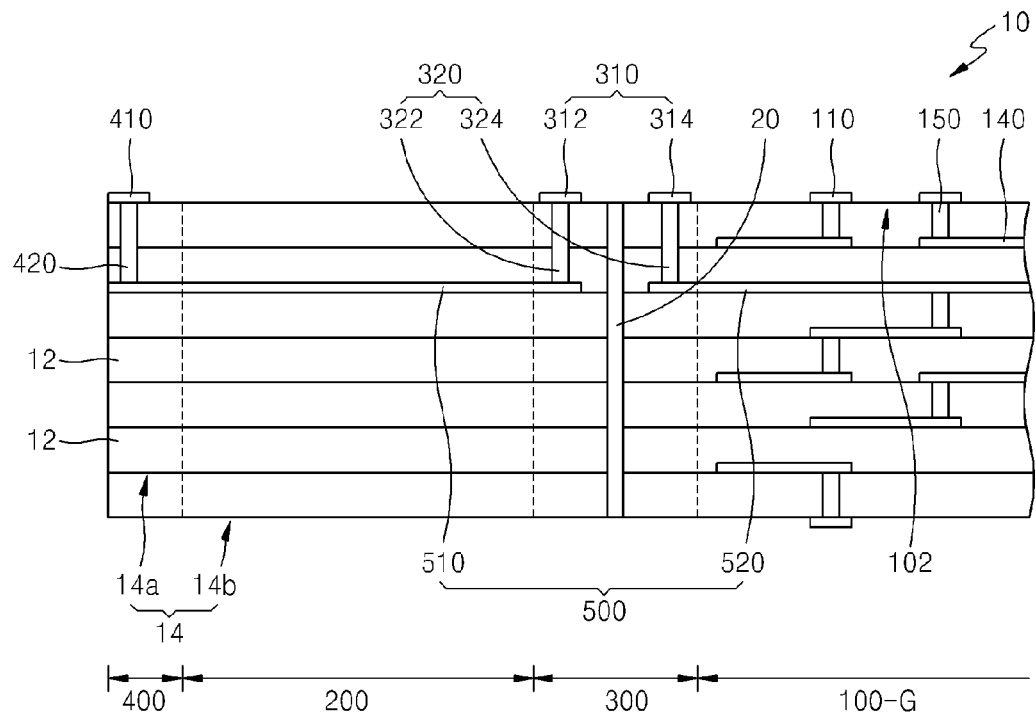
FIGS. 7A and 7B are cross-sectional views taken along a conductive pattern group of the array PCB of FIG. 6, having a non-defective single PCB joined thereto, according to embodiments of the inventive concepts.
Figure 7B:
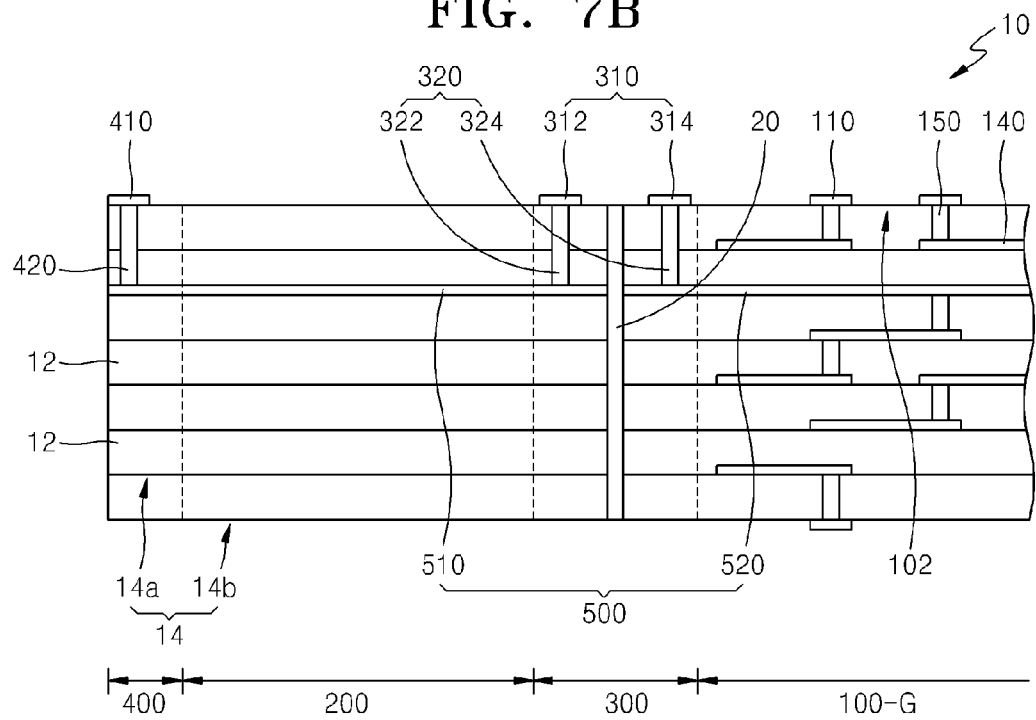

FIGS. 7A and 7B are cross-sectional views taken along a conductive pattern group of an array PCB 10 having a non-defective single PCB joined thereto, according to embodiments of the inventive concepts. FIG. 7A is a cross-sectional view illustrating a non-defective single PCB joined to the array PCB 10 shown in FIG. 5A, and FIG. 7B is a cross-sectional view illustrating a non-defective single PCB joined to the array PCB 10 shown in FIG. 5B.

Referring to FIGS. 7A and 7B, a non-defective single PCB 100-G may be joined to the array PCB 10 from which a defective single PCB portion was removed. In the conductive pattern group 500 shown in FIG. 2A, the first conductive pattern 510 and the second conductive pattern 520 are spaced apart from each other. In the conductive pattern group 500 shown in FIG. 2B, the first conductive pattern 510 and the second conductive pattern 520 are connected to each other. In FIGS. 7A and 7B, however, a first conductive pattern 510 of the array PCB 10 and a second conductive pattern 520 of the non-defective single PCB 100-G are spaced apart from each other by the junction layer 20, and thus may be electrically insulated in the tab route portion 300, regardless of whether the original array PCB 10 was that of the embodiment shown in FIG. 2A or FIG. 2B.

Figure 8:
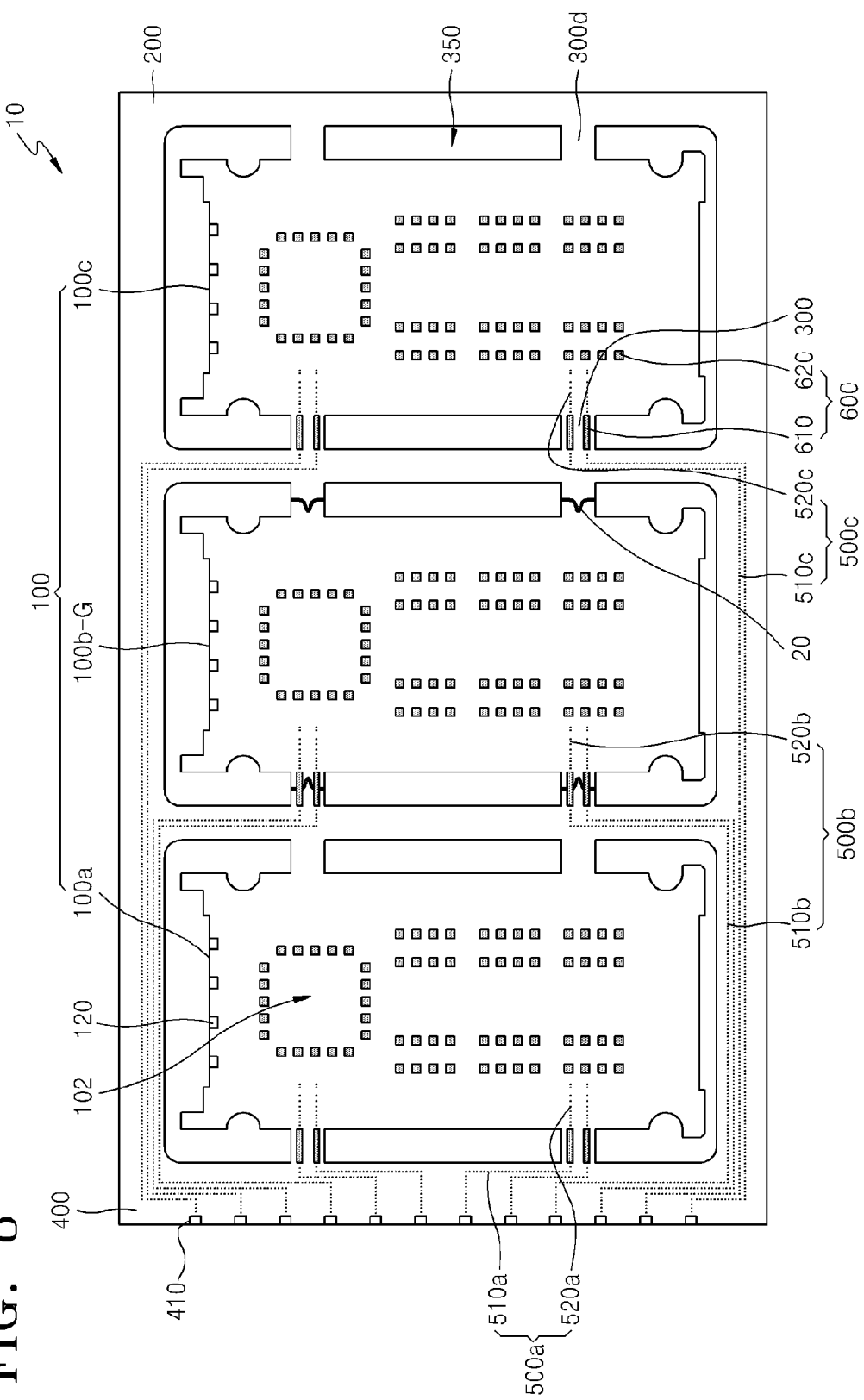
FIG. 8 is a plan view of an array PCB having a solder layer formed thereon, according to an embodiment of the inventive concepts.

FIG. 8 is a plan view of an array PCB 10 having a solder layer 600 formed thereon, according to an embodiment of the inventive concepts.

Referring to FIGS. 6 and 8, the solder layer 600 may be formed on the upper surface of the array PCB 10. The solder layer 600 may include a first solder layer 610 formed on the first and second via pads 312 and 314 and a second solder layer 620 formed on the electronic device pad 110. The first solder layer 610 and the second solder layer 620 may be formed together.

For example, the solder layer 600 may be formed by attaching a stencil mask on the surface of the array PCB 10 and then coating a solder material. The solder layer 600 may include one or more conductive materials, such as tin (Sn), silver (Ag), copper (Cu), palladium (Pd), bismuth (Bi), and antimony (Sb). Although in the embodiment illustrated in FIG. 8, the solder layer 600 is not formed on electronic apparatus terminals 120 and test terminals 410, the inventive concepts are not limited thereto. If desired, the solder layer 600 may be formed on the electronic apparatus terminals 120 and the test terminals 410.

Figure 9A:
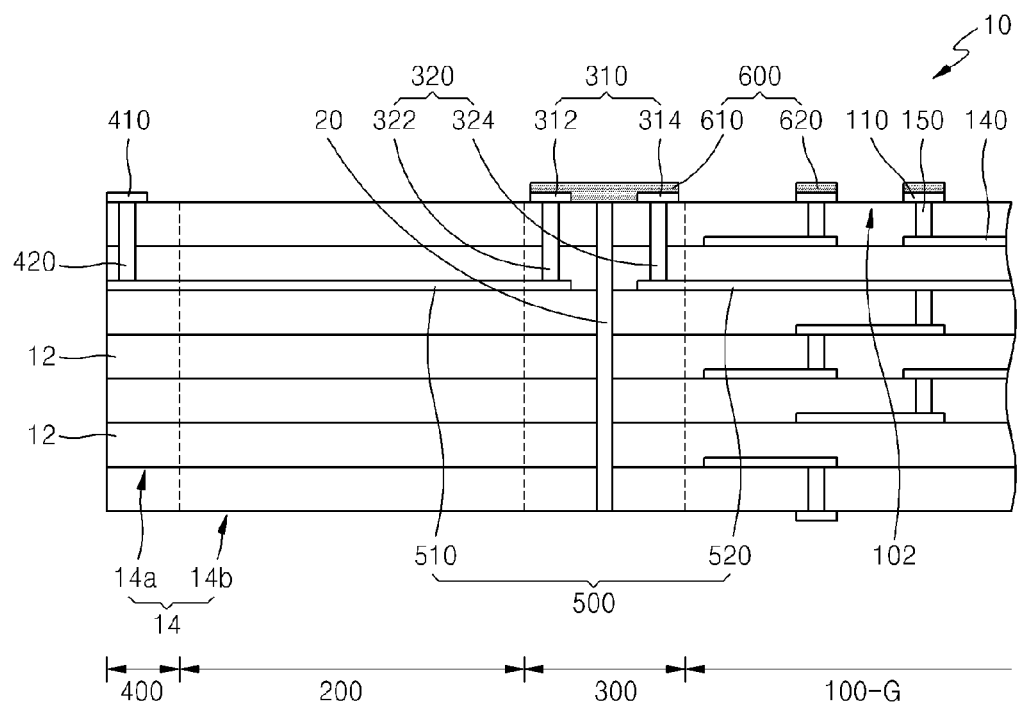
FIGS. 9A and 9B are cross-sectional views taken along a conductive pattern group of the array PCB of FIG. 8, to which a non-defective single PCB having a solder layer formed thereon was joined, according to embodiments of the inventive concepts.
Figure 9B:
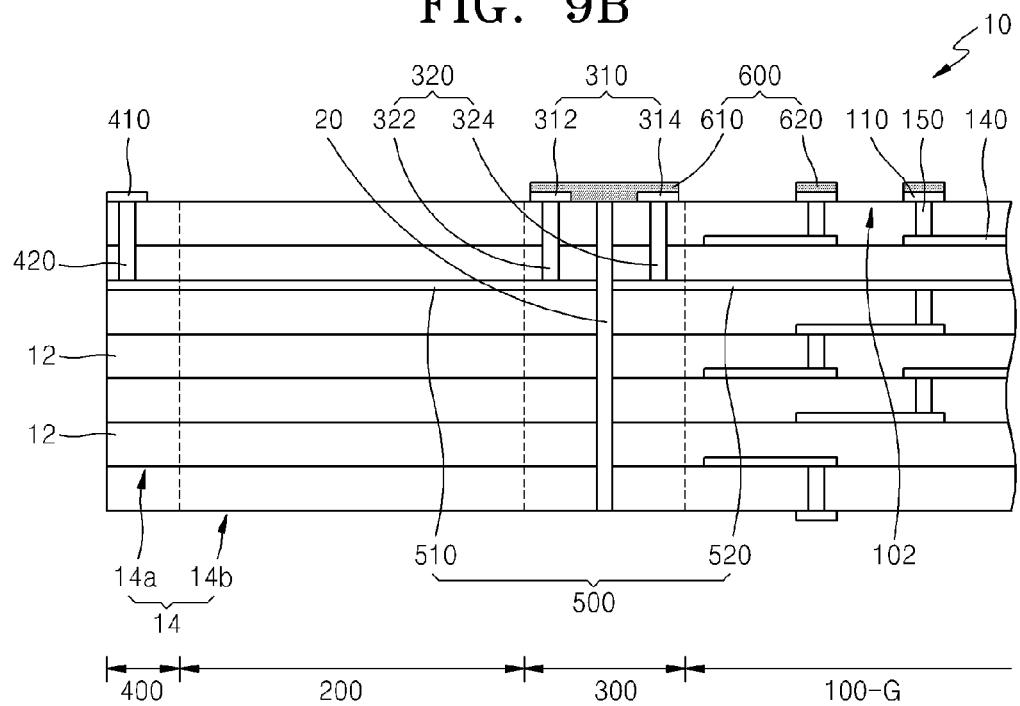

FIGS. 9A and 9B are cross-sectional views taken along a conductive pattern group of an array PCB 10 to which a non-defective single PCB having a solder layer formed thereon was joined, according to embodiments of the inventive concepts. FIG. 9A is a cross-sectional view illustrating an embodiment in which a solder layer is formed in the array PCB 10 of FIG. 7A, and FIG. 9B is a cross-sectional view of an embodiment in which a solder layer is formed in the array PCB 10 of FIG. 7B.

Referring to FIGS. 9A and 9B, a solder layer 600 may be formed on the upper surface of the array PCB 10. A first via electrode 322 and a second via electrode 324 may be electrically connected to each other by a first solder layer 610 of the solder layer 600. Thus, a first conductive pattern 510 and a second conductive pattern 520, which are connected to the first via electrode 322 and the second via electrode 324, respectively, may be electrically connected to each other by the first solder layer 610.

In the case where a first via pad 312 and a second via pad 314, which contact the first via electrode 322 and the second via electrode 324, respectively, are formed, the first solder layer 610 may extend from the surface of the first via pad 312 to the surface of the second via pad 314 to electrically connect the first via pad 312 and the second via pad 314. Thus, the first via electrode 322 and the second via electrode 324, which are connected to the first via pad 312 and the second via pad 314, respectively, may be electrically connected to each other.

Thus, while the first and second conductive patterns 510 and 520 shown FIGS. 7A and 7B are electrically insulated in the tab route portion 300, the first conductive patterns 510 and 520 shown in FIGS. 9A and 9B may be electrically connected to each other by the first solder layer 610.

Figure 10A:
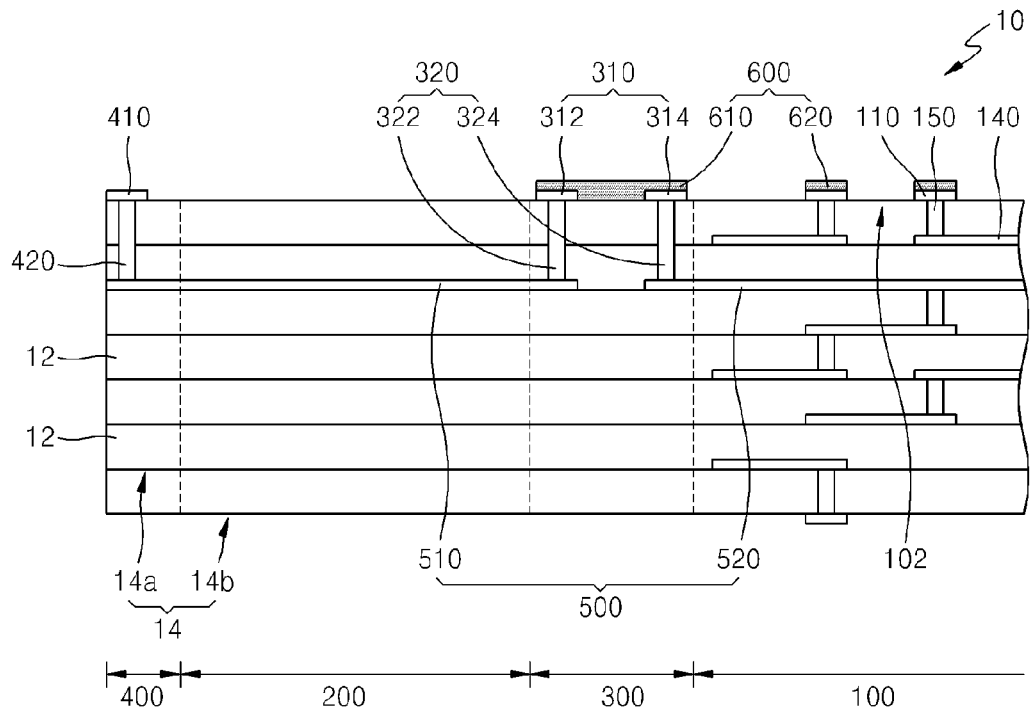
FIGS. 10A and 10B are cross-sectional views taken along a conductive pattern group of the array PCB of FIG. 8, having a solder layer formed thereon, according to embodiments of the inventive concepts.
Figure 10B:
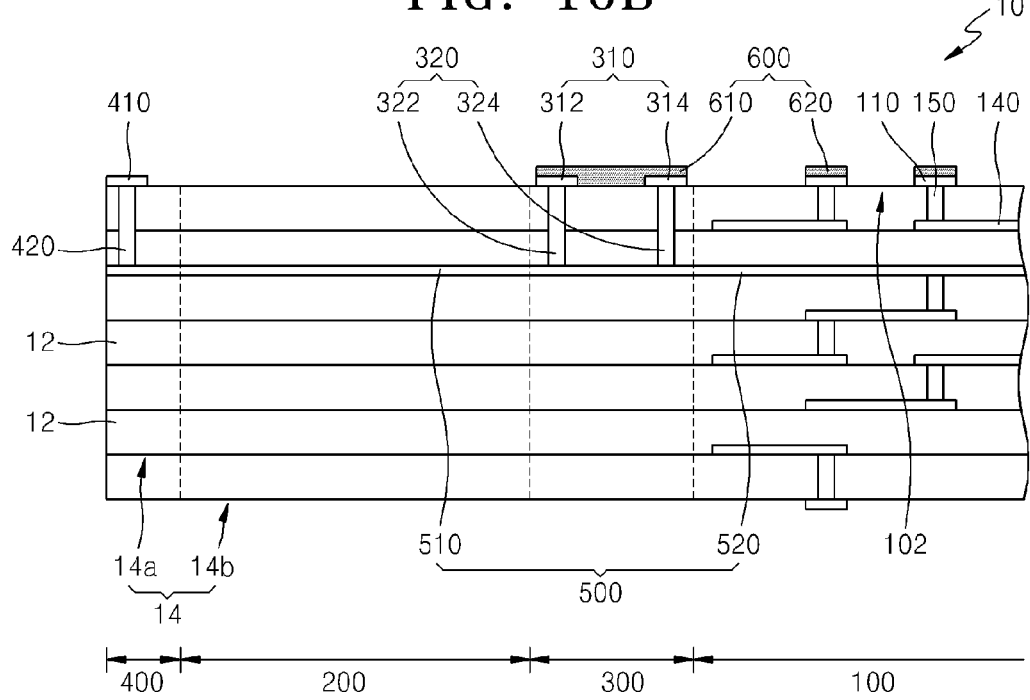

FIGS. 10A and 10B are cross-sectional views taken along a conductive pattern group of an array PCB 10 having a solder layer formed thereon, according to embodiments of the inventive concepts. More particularly, FIGS. 10A and 10B are cross-sectional views taken along a conductive pattern group of a non-defective single PCB portion 100 that remains unremoved from the array PCB 10. FIG. 10A is a cross-sectional view of an embodiment in which a solder layer is formed in the array PCB 10 of FIG. 2A, and FIG. 10B is a cross-sectional view of an embodiment in which a solder layer is formed in the array PCB 10 of FIG. 2B.

Referring to FIGS. 10A and 10B, a solder layer 600 may be formed on the upper surface of the array PCB 10. A first via electrode 322 and a second via electrode 324 may be electrically connected to each other by a first solder layer 610 of the solder layer 600. Thus, a first conductive pattern 510 and a second conductive pattern 520, which are connected to the first via electrode 322 and the second via electrode 324, respectively, may be electrically connected to each other by the first solder layer 610.

In the case where a first via pad 312 and a second via pad 314, which contact the first via electrode 322 and the second via electrode 324, respectively, are formed, the first solder layer 610 may extend from the surface of the first via pad 312 to the surface of the second via pad 314 to electrically connect the first via pad 312 and the second via pad 314. Thus, the first via electrode 322 and the second via electrode 324, which are connected to the first via pad 312 and the second via pad 314, respectively, may be electrically connected to each other.

Although the first and second conductive patterns 510 and 520 shown FIG. 10A are electrically insulated in the tab route portion 300, the first and second conductive patterns 510 and 520 may be electrically connected to each other by the first solder layer 610. On the other hand, although the first and second conductive patterns 510 and 520 shown in FIG. 10B are electrically connected to each other in the tab route portion 300, the first and second conductive patterns 510 and 520 may be additionally electrically connected to each other by the first solder layer 610.

That is, in the array PCB 10 shown in FIG. 2A, the first and second conductive patterns 510 and 520 remain electrically insulated until the first solder layer 610 is formed, and may be electrically connected to each other by the first solder layer 610, as shown in FIG. 10A. However, in the array PCB 10 shown in FIG. 2B, the first and second conductive patterns 510 and 520 remain electrically connected to each other until a corresponding defective single PCB portion is removed. When the corresponding defective single PCB portion is replaced with a non-defective single PCB, the first and second conductive patterns 510 and 520 are electrically insulated only at an area where the defective single PCB portion was replaced with the non-defective single PCB. And then, the first conductive pattern 510 and the second conductive pattern 520 may be electrically connected to each other again by the first solder layer 610.

Also, in the case where all of the single PCB portions 100 of the array PCB 10 shown in FIG. 2A are non-defective single PCB portions, the first conductive pattern 510 and the second conductive pattern 520 may be electrically connected to each other by the first solder layer 610. In this case, since the first solder layer 610 is formed together with a second solder layer 620 for attaching electronic devices to be described below, an additional process is not needed to form the first solder layer 610.

Thus, the array PCB 10 according to the embodiments of the inventive concepts may be used regardless of whether or not replacement of a defective single PCB portion with a non-defective single PCB is required. The inventive concepts may also be used regardless of whether the first conductive pattern 510 and the second conductive pattern 520 are initially electrically insulated or are initially connected to each other.

Figure 11A:
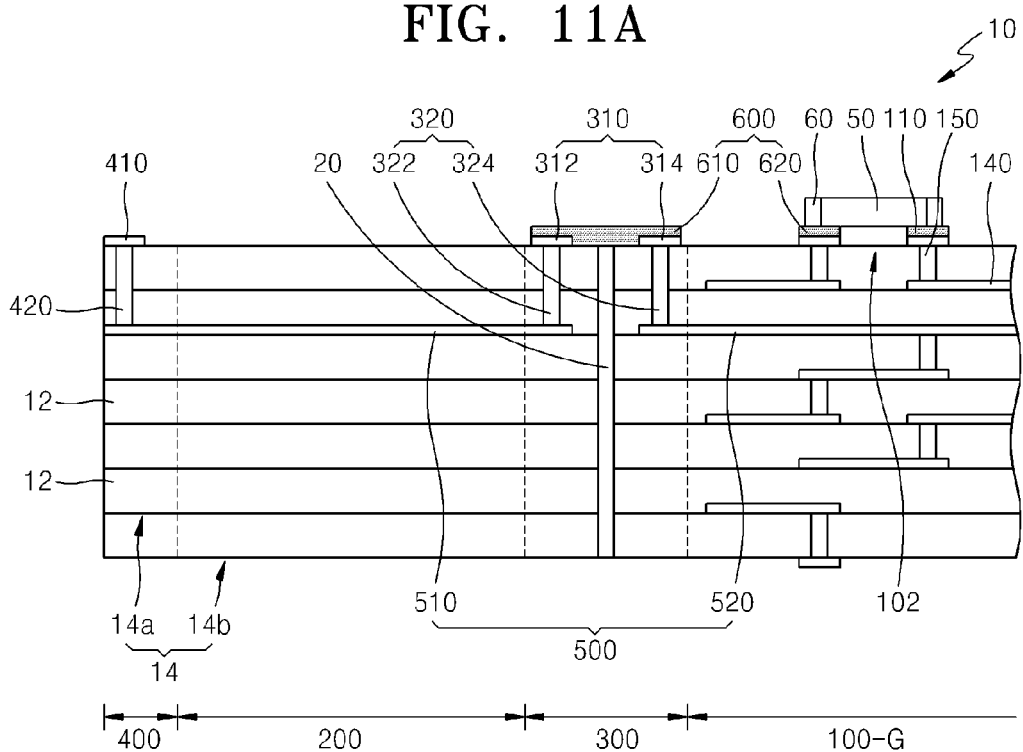
FIGS. 11A and 11B are cross-sectional views taken along a conductive pattern group of an array PCB to which a non-defective single PCB having an electronic device mounted thereon has been joined, according to some embodiments of the inventive concepts.
Figure 11B:
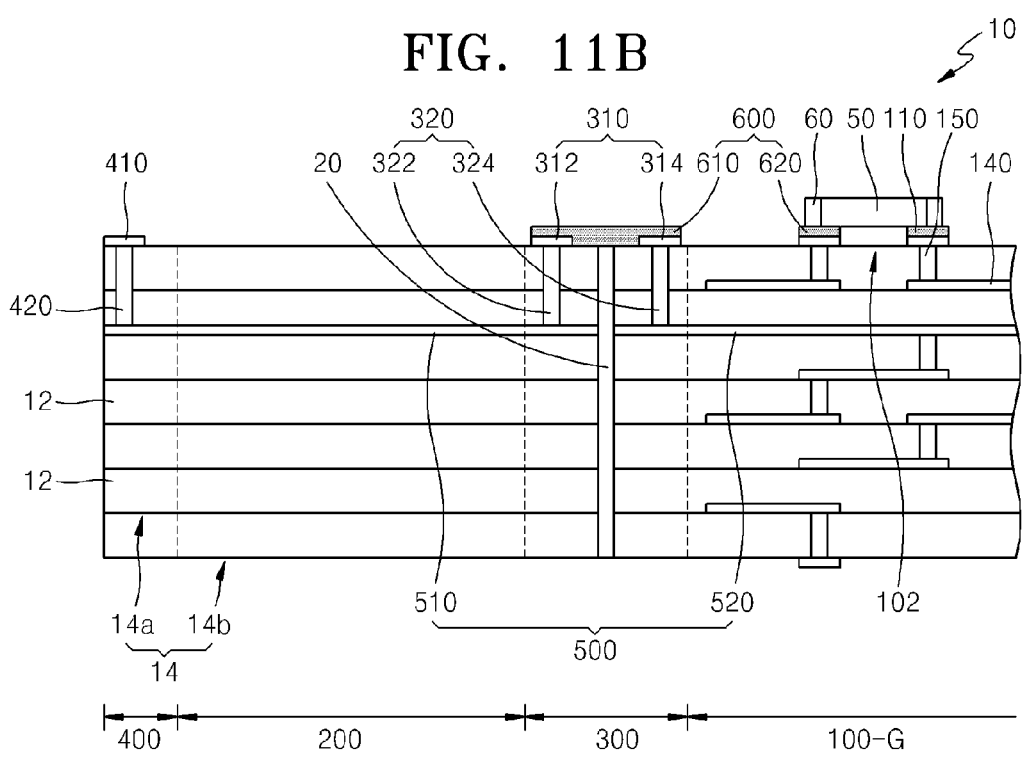

FIGS. 11A and 11B are cross-sectional views taken along a conductive pattern group of an array PCB 10 to which a non-defective single PCB having an electronic device mounted thereon was joined, according to further embodiments of the inventive concepts. FIG. 11A is a cross-sectional view of an embodiment in which an electronic device is mounted on the array PCB 10 of FIG. 9A, and FIG. 11B is a cross-sectional view of an embodiment in which an electronic device is mounted on the array PCB 10 of FIG. 9B.

FIG. 12 is a cross-sectional view taken along a conductive pattern group of an array PCB 10 having an electronic device mounted thereon, according to an embodiment of the inventive concepts. FIG. 12 is a cross-sectional view of an embodiment in which an electronic device is mounted on the array PCB 10 of FIG. 10A.

The array PCB 10 shown in FIG. 10A and the array PCB 10 shown in FIG. 10B are different only with respect to the tab route portion 300. Thus, embodiments in which an electronic device is mounted on the array PCB 10 of FIG. 10B is substantially the same as that shown in FIG. 12, except with respect to the tab route portion 300, and thus, a separate description thereof is omitted.

Referring to FIGS. 11A and 12, an electronic device 50 may be mounted on an electronic device mounting area 102. The electronic device 50 may be mounted on the electronic device mounting area 102 so as to contact the second solder layer 620. An additional solder layer 60 may be selectively formed beside the electronic device 50. The additional solder layer 60 may be used to strengthen an electrical connection between the second solder layer 620 and the electronic device 50, but, depending on the electronic device 50, may not be needed.

Figure 13:
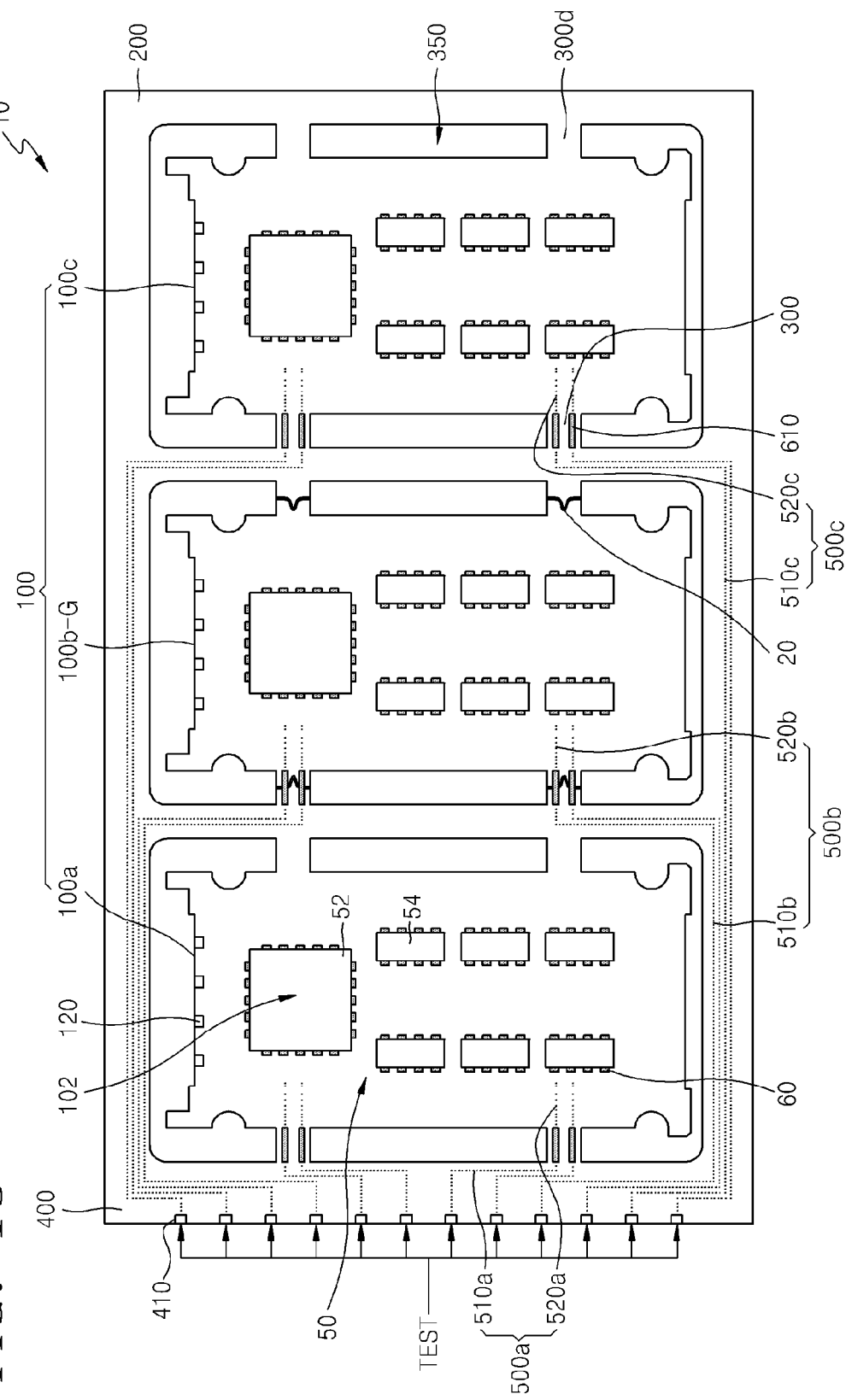
FIG. 13 is a plan view of an array PCB in which a reflow process has been performed on a solder layer, according to an embodiment of the inventive concepts.
Figure 14:
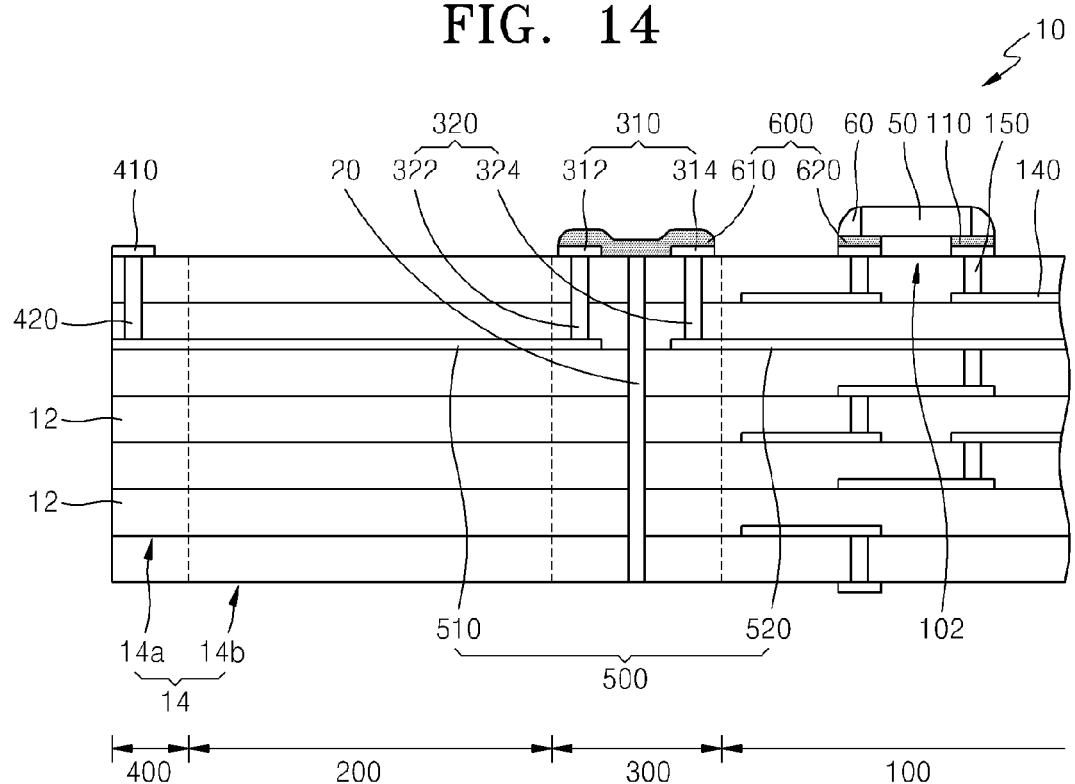
FIG. 14 is a cross-sectional view taken along a conductive pattern group of the array PCB 10 of FIG. 13, having a non-defective single PCB joined thereto and in which a reflow process was performed on a solder layer, according to an embodiment of the inventive concepts.
Figure 15:
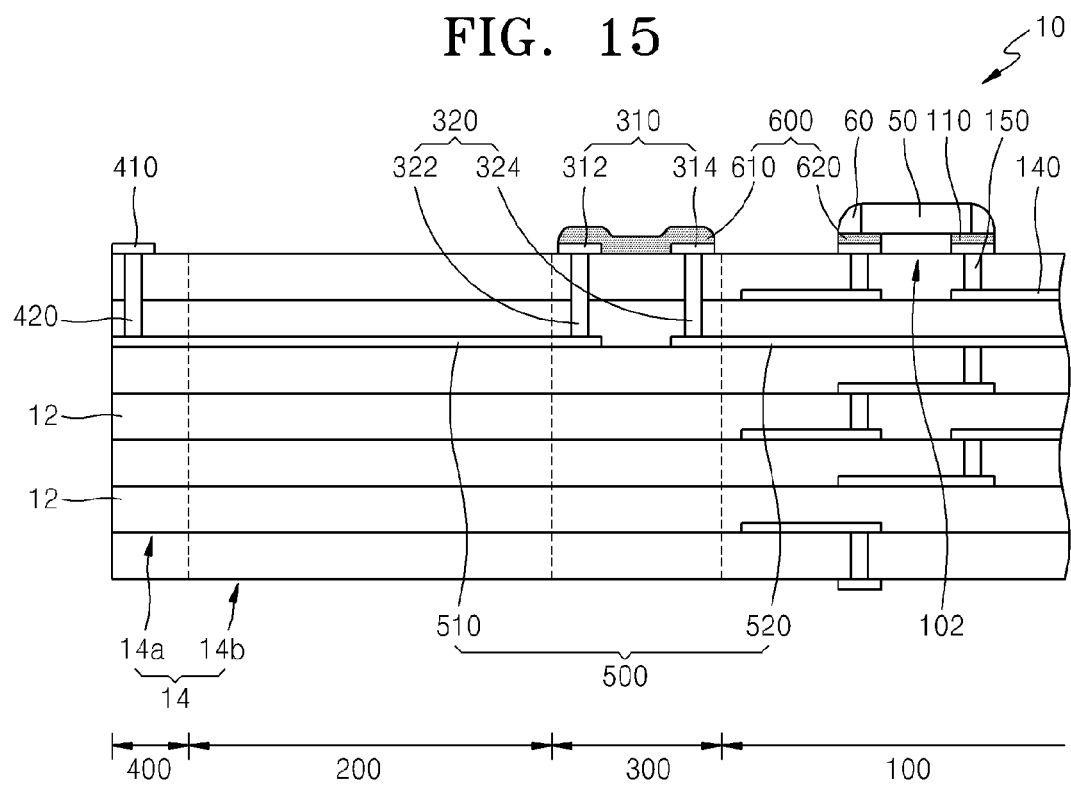
FIG. 15 is a cross-sectional view taken along a conductive pattern group of the array PCB 10 of FIG. 13, in which a reflow process was performed on a solder layer, according to an embodiment of the inventive concepts.

FIG. 13 is a plan view illustrating an array PCB in which a reflow process has been performed on a solder layer, according to an embodiment of the inventive concepts. FIG. 14 is a cross-sectional view taken along a conductive pattern group of an array PCB 10 having a non-defective single PCB joined thereto, in which a reflow process has been performed on a solder layer, according to an embodiment of the inventive concepts. FIG. 15 is a cross-sectional view taken along a conductive pattern group of an array PCB 10 in which a reflow process has been performed on a solder layer, according to an embodiment of the inventive concepts.

Referring to FIGS. 13 through 15, a reflow process using energy, such as heat or ultrasound, may be performed on a solder layer 600, to electrically connect an electronic device 50 to a single PCB portion 100.

For example, when an electronic device 50 to be formed using the single PCB portion 100 is a solid state disc (SSD), the electronic device 50 may include a memory controller 52 and a nonvolatile memory device 54. However, the inventive concepts are not limited thereto.

The electronic device 50 may include a system large scale integration (LSI), a flash memory, dynamic random access memory (DRAM), static random access memory (SRAM), electrically erasable programmable read only memory (EE-PROM), phase change RAM (PRAM), magnetic RAM (MRAM), or resistive RAM. The electronic device 50 may include various kinds of individual devices. The individual devices may include various microelectronic devices, for example, a metal-oxide-semiconductor field effect transistor (MOSFET) such as a complementary metal-insulator-semiconductor (CMOS) transistor, a system LSI, an image sensor such as a CMOS imaging sensor (SIS), a micro-electro-mechanical system (MEMS), an active device, a passive device, and the like. Alternatively, the electronic device 50 may be a passive device, such as a resistor, a capacitor, or an inductor, or may be an active device, such as a diode or a transistor.

After electrically connecting the electronic device 50 to the single PCB portion 100, a test for a plurality of single PCB portions 100 may be performed via a test terminal 410 of a test terminal portion 400. The test may be simultaneously performed in parallel with respect to each of the plurality of single PCB portions 100. Since the first conductive patterns 510*a*, 510*b*, and 510*c* of the conductive pattern groups 500*a*, 500*b*, and 500*c* described above are connected to the second conductive patterns 520*a*, 520*b*, and 520*c* of the conductive pattern groups 500*a*, 500*b*, and 500*c*, respectively, by a first solder layer 610, the test terminal 410 may be electrically connected to each of the plurality of single PCB portions 100 through the conductive pattern groups 500*a*, 500*b*, and 500*c*, respectively.

Although in FIGS. 11A through 15, the electronic device 50 is attached to a single PCB portion 100 using the solder layer 600, a method of attaching the electronic device 50 to a single PCB portion 100 is not limited thereto. For example, when attaching a plurality of electronic devices to a plurality of single PCB portions 100, some of the plurality of electronic devices may be attached to some of the plurality of single PCB portions 100 using a surface-mounting technology (SMT) using the solder layer 600, and the other electronic devices may be attached to the other single PCB portions 100 using other methods, such as wire bonding technology, flip-chip bonding technology, and the like.

Figure 16:
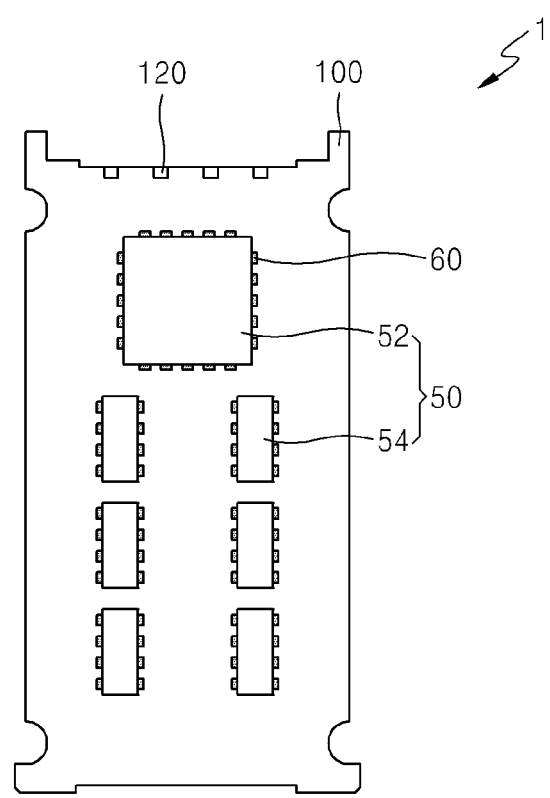
FIG. 16 is a plan view of an electronic apparatus according to an embodiment of the inventive concepts.
Figure 17:
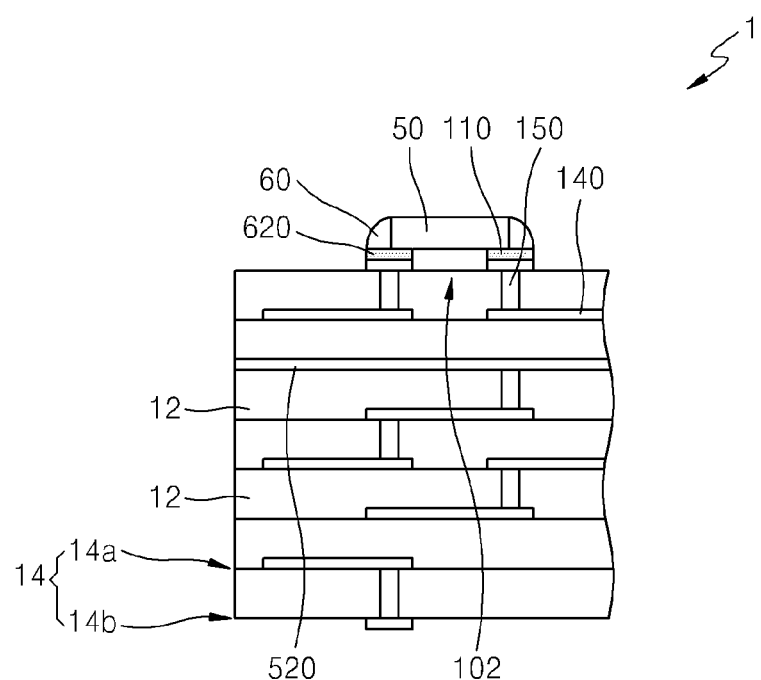
FIG. 17 is a partial cross-sectional view of the electronic apparatus of FIG. 16 according to an embodiment of the inventive concepts.

FIG. 16 is a plan view of an electronic apparatus according to an embodiment of the inventive concepts. FIG. 17 is a cross-sectional view illustrating an electronic apparatus according to an embodiment of the inventive concepts.

Referring to FIGS. 13 through 17, the single PCB portion 100 may be separated from the array PCB 10 to form an electronic device 1. More particularly, in order to form the electronic device 1, the single PCB portion 100 may be separated from the tab route portions 300 and the dummy tab route portions 300*d* connected thereto in the array PCB 10. For example, a space between the single PCB portion 100 and the tab route portions 300 and a space between the single PCB portion 100 and the dummy tab route portions 300*d* may be cut in order to form the electronic device 1. Alternatively, the rail portion 200, the tab route portions 300, and the test terminal portion 400 may be removed from the array PCBs 10 shown in FIGS. 2A through 2E to form the electronic device 1. Thus, regardless of which of the array PCBs 10 shown in FIGS. 2A through 2E is used to form the electronic device 1, the configuration of the electronic device 1 itself is not changed.

Figure 18:
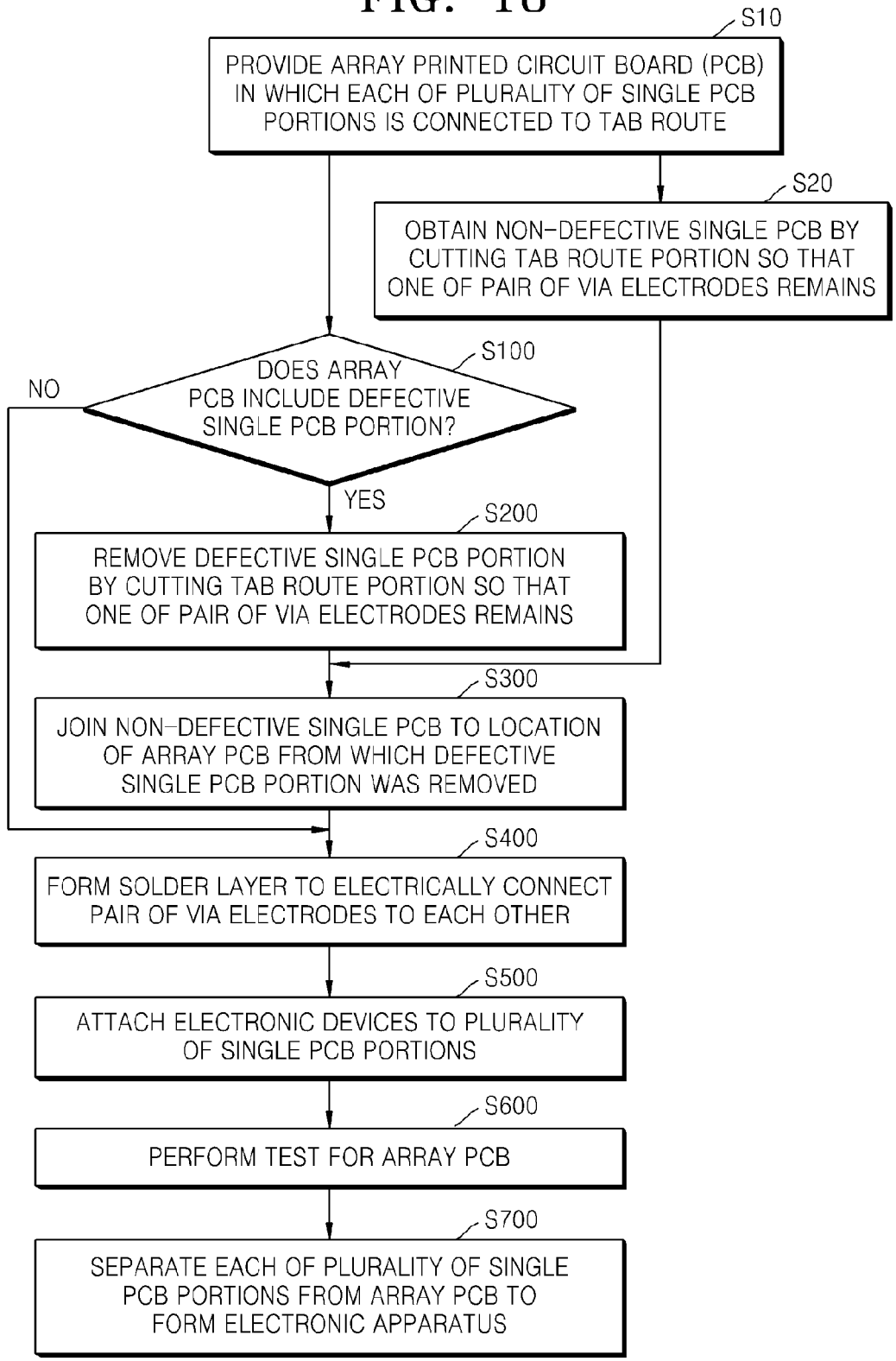
FIG. 18 is a flowchart illustrating a method of replacing a defective single PCB portion of an array PCB, and a method of manufacturing an electronic device using the array PCB, according to another aspect of the inventive concepts.

FIG. 18 is a flowchart illustrating a method of replacing a defective single PCB portion of an array PCB, and a method of manufacturing an electronic device using the array PCB, according to an embodiment of the inventive concepts.

Referring to FIG. 18 together with FIGS. 1 through 3, in a first step (S10), an array PCB 10 is provided having a plurality of single PCB portions 100 connected to corresponding tab route portions 300, which have a pair of via electrodes 320 formed therein. In the following step (S100), it is determined whether the array PCB 10 includes any defective single PCB portions.

Referring now to FIG. 18 together with FIGS. 4A through 5B, in another step (S20), a non-defective single PCB 100-G may be obtained by cutting a tab route portion 300 and a dummy tab route portion 300*d* in the array PCB 10 such that one of the pair of via electrodes 320 remains on the non-defective single PCB 100-G.

Referring to FIG. 18 together with FIGS. 4A, 5A, and 5B, in a step (S200), when any one of the plurality of single PCBs 100 in the array PCB 10 is defective, the defective single PCB is removed by cutting a tab route portion 300 corresponding to the defective single PCB portion such that one of the pair of via electrodes 320 remains connected to the array PCB 10.

Referring to FIG. 18 together with FIGS. 6 through 7B, in a subsequent operation (S300), the non-defective single PCB 100-G may be joined to the array PCB 10 in the location from which the defective single PCB portion was removed.

Referring to FIG. 18 together with FIGS. 8 through 10B, in a step (S400), a solder layer 600 may be formed to electrically connect a pair of via electrodes 320 formed in the tab route portion 300 of the array PCB 10. In this case, the array PCB 10 may be an array PCB that does not include a defective single PCB portion, or may be an array PCB obtained by joining a non-defective single PCB to the array PCB 10 after removing a defective single PCB from the array PCB 10.

Referring to FIG. 18 together with FIGS. 11A through 12, electronic devices 50 may be attached to corresponding ones of the plurality of single PCBs 100 of the array PCB 10 in a following step (S500).

Referring to FIG. 18 together with FIGS. 13 through 15, a test operation (S600) for the array PCB 10 may be performed following a reflow process on the solder layer 600 formed in the array PCB 10.

Referring to FIG. 18 together with FIGS. 16 and 17, each of the plurality of single PCB portions may be separated from the array PCB 10 to form an electronic apparatus 1 through a separating process (S700).

Figure 19:
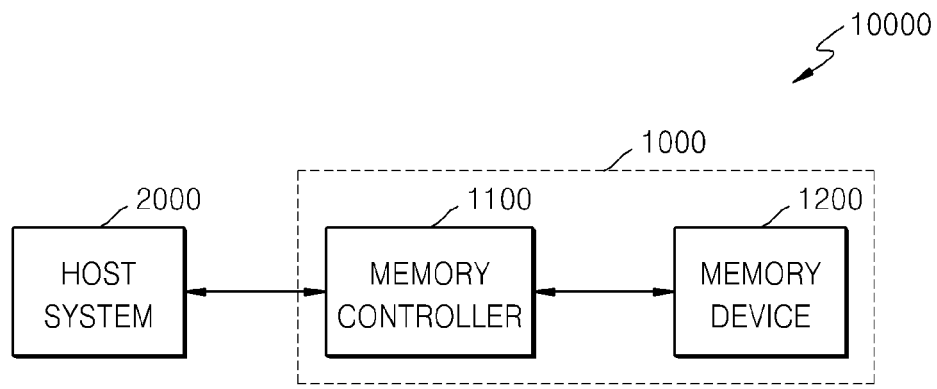
FIG. 19 is a block diagram of an electronic apparatus according to an embodiment of the inventive concepts.

FIG. 19 is a block diagram of an electronic apparatus 10000 according to an embodiment of the inventive concepts.

Referring to FIG. 19, the electronic apparatus 10000 may include a memory system 1000 and a host system 2000. The memory system 1000 may include a memory controller 1100 and a memory device 1200.

The memory system 1000 may implement, for example, an SSD. The electronic apparatus 1 illustrated in FIG. 17 or FIG. 18 may, for example, be applied to the memory system 1000 illustrated in FIG. 19.

The host system 2000 generates a host command for storing data in the memory system 1000 or reading data from the memory system 1000, and transmits the generated host command to the memory system 1000.

The memory controller 1100 may process data transmitted from the host system 2000 according to a host command and may perform a write operation for storing the processed data in the memory device 1200. Also, the memory controller 1100 may read data from the memory device 1200 according to a host command and may perform an operation for processing the read data and transmitting the processed data to the host system 2000.

The memory device 1200 may, for example, be a flash memory device, PRAM, Ferroelectric RAM (FRAM), MRAM, or the like. Also, the memory device 1200 may have a form in which two kinds of nonvolatile memory devices are mixed.

Figure 20:
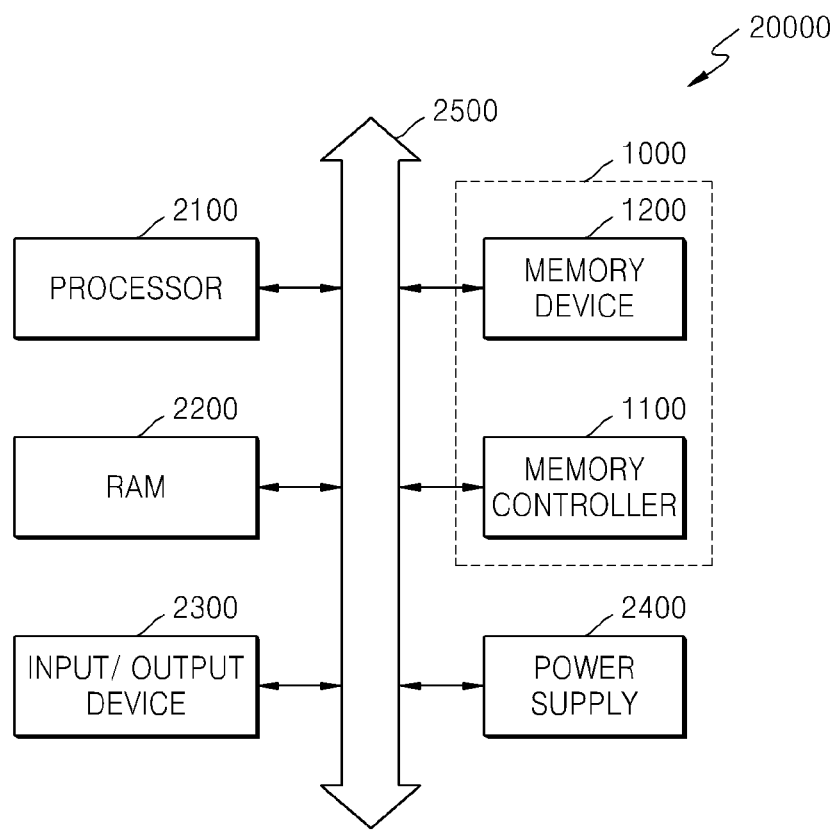
FIG. 20 is a block diagram of an electronic system using an electronic apparatus, according to an embodiment of the inventive concepts.

FIG. 20 is a block diagram of an electronic system 20000 using an electronic apparatus, according to another embodiment of the inventive concepts.

Referring to FIG. 20, the electronic system 20000 may include a processor 2100, RAM 2200, an input/output device 2300, a power supply 2400, and a memory system 1000. Although not illustrated in FIG. 20, the electronic system 20000 may further include ports that may communicate with a video card, a sound card, a memory card, a universal serial bus (USB) device, and the like, or may communicate with other electronic devices. The electronic system 20000 may be implemented in or with a personal computer or a mobile electronic device, such as a notebook computer, a mobile phone, a personal digital assistant (PDA), a camera, or the like.

The electronic apparatus 1 illustrated in FIG. 17 or FIG. 18 may be applied to the memory system 1000 illustrated in FIG. 20.

The processor 2100 may perform specific calculations or tasks. The processor 2100 may be a microprocessor or a central processing unit (CPU). The processor 2100 may communicate with the RAM 2200, the input/output device 2300, and the memory system 1000 via buses 2500, such as an address bus, a control bus, and a data bus. The processor 2100 may also be connected to an expansion bus such as a peripheral component interconnect (PCI) bus.

The RAM 2200 may store data required for an operation of the electronic system 20000. For example, the RAM 2200 may be implemented with DRAM, mobile DRAM, SRAM, PRAM, FRAM, RAM, and/or MRAM.

The input/output device 2300 may include an input device, such as a keyboard, a keypad, a mouse, or the like, and an output device, such as a printer, a display, or the like. The power supply 2400 may supply an operating voltage required for operation of the electronic system 20000.

Figure 21:
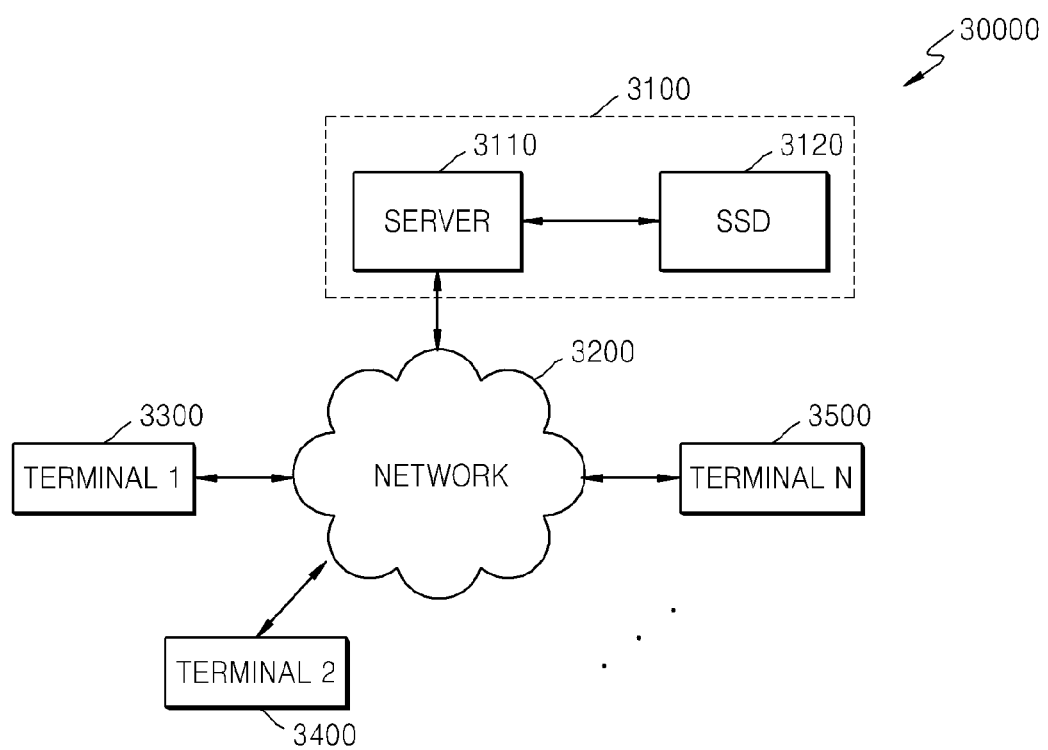
FIG. 21 is a block diagram of a network system for a server system including an electronic apparatus, according to an embodiment of the inventive concepts.

FIG. 21 is a block diagram illustrating a network system 30000 for a server system including an electronic apparatus, according to an embodiment of the inventive concepts.

Referring to FIG. 21, the network system 30000 may include a server system 3100 and a plurality of terminals 3300, 3400, and 3500, which are connected to each other via a network 3200. The server system 3100 may include a server 3110 that processes requests received from the plurality of terminals 3300, 3400, and 3500 and an electronic apparatus 3120 that stores data corresponding to the requests received from the plurality of terminals 3300, 3400, and 3500. In this case, the electronic apparatus 1 illustrated in FIG. 17 or FIG. 18 may be applied to the electronic apparatus 3120. The electronic apparatus 3120 may be an SSD.

The above-described electronic apparatuses according to the embodiments of the inventive concepts may be mounted on a system by using various types of packages. For example, the above-described electronic apparatuses may be mounted using packages, such as Package on Package (PoP), Ball Grid Array (BGA), Chip Scale Package (CSP), Plastic Leaded Chip Carrier (PLCC), Plastic Dual In-Line Package (PDIP), Die in Waffle Pack (DWP), Die in Wafer Form (DWF), Chip On Board (COB), Ceramic Dual In-Line Package (CERDIP), Plastic Metric Quad Flat Pack (MQFP), Thin Quad Flat Pack (TQFP), Small Outline Integrated Circuit (SOIC), Shrink Small Outline Package (SSOP), Thin Small Outline Package (TSOP), System In Package (SIP), Multi Chip Package (MCP), Wafer-level Fabricated Package (WFP), Wafer-Level Processed Stack Package (WSP), and the like.

While the inventive concepts have been particularly shown and described with reference to exemplary embodiments thereof, it will be understood that various changes in form and details may be made therein without departing from the spirit and scope of the following claims.

What is claimed is:
1. An array printed circuit board (PCB) comprising:
a plurality of single PCB portions each having an electronic device mounting area formed on an upper surface thereof;
a rail portion surrounding the plurality of single PCB portions;
a plurality of tab route portions connecting the plurality of single PCB portions to the rail portion, each of the plurality of tab route portions comprising at least one pair of via electrodes extending from an upper surface of the each tab route portion toward an inside thereof, wherein the at least one pair of via electrodes comprises a first via electrode arranged adjacent to the rail portion and a second via electrode arranged adjacent to a corresponding single PCB portion;
a test terminal portion formed at one side of the rail portion, the test terminal portion comprising a plurality of test terminals;

a first conductive pattern extending through the rail portion to electrically connect the first via electrode to a corresponding one of the plurality of test terminals; and a second conductive pattern electrically connected to the second via electrode and extending to a corresponding one of the single PCB portions.

2. The array PCB of claim 1, wherein the plurality of single PCB portions, the rail portion, and the plurality of tab route portions each comprise a plurality of insulating layers and a plurality of conductive material layers, wherein the plurality of conductive material layers are separated by the plurality of insulating layers, and wherein the first and second conductive patterns comprise at least some of the conductive material layers and are arranged along a same layer interposed between a pair of insulating layers.

3. The array PCB of claim 1, wherein the first via electrode and the second via electrode extend from an upper surface of a corresponding tab route portion to the first conductive pattern and the second conductive pattern, respectively.

4. The array PCB of claim 1, wherein the first via electrode and the second via electrode penetrate the first conductive pattern and the second conductive pattern, respectively, from an upper surface of a corresponding tab route portion toward a lower surface of the corresponding tab route portion.

5. The array PCB of claim 1, wherein the first conductive pattern and the second conductive pattern are connected to each other.

6. The array PCB of claim 1, wherein the first conductive pattern and the second conductive pattern are spaced apart from each other in a corresponding tab route portion.

7. The array PCB of claim 1, further comprising a first via pad and a second via pad formed on an upper surface of a corresponding tab route portion and connected to the first via electrode and the second via electrode, respectively.

8. The array PCB of claim 1, wherein the plurality of single PCB portions, the rail portion, and the plurality of tab route portions each comprise a plurality of insulating layers and a plurality of conductive material layers, said plurality of conductive material layers comprising a plurality of layers that are separated from each other by corresponding ones of the plurality of insulating layers, wherein the first conductive pattern comprises a plurality of first conductive patterns, each of which connects a test terminal of the test terminal portion to a first via electrode of the plurality of tab route portions, and wherein at least some of the plurality of first conductive patterns are conductive material layers comprising at least two layers.

9. An array printed circuit board (PCB) comprising:
a plurality of single PCB portions each having an electronic device mounting area formed on an upper surface thereof;
a rail portion surrounding the plurality of single PCB portions;
a plurality of tab route portions connecting the plurality of single PCB portions to the rail portion, each of the plurality of tab route portions comprising at least one pair of via electrodes extending from an upper surface of the each tab route portion toward an inside thereof; and
a test terminal portion formed at one side of the rail portion, the test terminal portion comprising a plurality of test terminals,
wherein the at least one pair of via electrodes comprises a first via electrode arranged adjacent to the rail portion and electrically connected to a corresponding test terminal, and a second via electrode arranged adjacent to a corresponding single PCB portion and electrically connected to the corresponding single PCB portion.

10. The array PCB of claim 9, wherein the corresponding test terminal and the first via electrode are connected to each other via a first conductive pattern extending in the array PCB, and wherein the corresponding single PCB portion and the second via electrode are connected to each other via a second conductive pattern extending in the array PCB.

11. The array PCB of claim 10, wherein the first conductive pattern and the second conductive pattern are formed at the same level from an upper surface of the array PCB.

12. The array PCB of claim 10, wherein the first conductive pattern is a multi-layered pattern extending in the array PCB.

13. The array PCB of claim 12, wherein the first conductive pattern comprises at least one via plug that connects patterns of the multi-layered pattern to each other.

14. The array PCB of claim 12, wherein a pattern of at least one layer from among the multi-layer patterns of the first conductive pattern and the second conductive pattern are formed at the same level from an upper surface of the array PCB.

15. An array printed circuit board (PCB) comprising:
a plurality of single PCB portions;
a rail portion surrounding the plurality of single PCB portions;
a plurality of tab route portions connecting the plurality of single PCB portions to the rail portions;
a pair of via electrodes arranged in one or more of the tab route portions connected to a corresponding one of the single PCB portions, said via electrodes extending from an upper surface of the tab route portion toward an inner portion thereof;
a test terminal portion arranged at one or more sides of the rail portion, the test terminal portion comprising a plurality of test terminals;
a first via electrode from among the pair of via electrodes arranged adjacent to the rail portion and being electrically connected to a corresponding test terminal; and
a second via electrode from among the pair of via electrodes arranged adjacent to and electrically connected to the corresponding single PCB portion.

16. The array PCB of claim 15 further comprising a solder layer electrically connecting the first via electrode to the second via electrode.

* * * * *